US009564578B2

(12) United States Patent
Meyer et al.

(10) Patent No.: US 9,564,578 B2
(45) Date of Patent: Feb. 7, 2017

(54) SEMICONDUCTOR PACKAGE WITH INTEGRATED MAGNETIC FIELD SENSOR

(71) Applicant: Infineon Technologies AG, Neubiberg (DE)

(72) Inventors: Thorsten Meyer, Regensburg (DE);
Martin Gruber, Schwandorf (DE);
Rainer Markus Schaller, Regensburg (DE); Franz Jost, Stuttgart (DE);
Stefan Mieslinger, Kottgeisering (DE);
Liu Chen, Munich (DE); Toni Salminen, Munich (DE); Giuliano Angelo Babulano, Ottobrunn (DE);
Jens Oetjen, Ottenhofen (DE); Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/947,649

(22) Filed: Nov. 20, 2015

(65) Prior Publication Data
US 2016/0380181 A1     Dec. 29, 2016

Related U.S. Application Data

(63) Continuation-in-part of application No. 14/747,382, filed on Jun. 23, 2015.

(51) Int. Cl.
*H01L 25/16* (2006.01)
*H01L 43/02* (2006.01)
(Continued)

(52) U.S. Cl.
CPC .............. *H01L 43/02* (2013.01); *G01R 33/07* (2013.01); *G01R 33/09* (2013.01); *H01L 43/065* (2013.01); *H01L 43/08* (2013.01)

(58) Field of Classification Search
CPC ........................... H01L 25/16; H01L 23/49575
See application file for complete search history.

(56) References Cited

U.S. PATENT DOCUMENTS

| 7,199,435 | B2 * | 4/2007 | Elbanhawy | ............. H01L 27/22 257/379 |
| 2013/0264721 | A1 | 10/2013 | Landau et al. | |
| 2014/0327436 | A1 | 11/2014 | Castro Serrato | |

FOREIGN PATENT DOCUMENTS

| DE | 102007044485 A1 | 4/2009 |
| DE | 102013103351 A1 | 10/2013 |
| DE | 102014106133 A1 | 11/2014 |

* cited by examiner

*Primary Examiner* — Mark Prenty
(74) *Attorney, Agent, or Firm* — Murphy, Bilak & Homiller, PLLC

(57) ABSTRACT

A semiconductor package includes a semiconductor die attached to a substrate and a magnetic field sensor included as part of the same semiconductor package as the semiconductor die and positioned in close proximity to a current pathway of the semiconductor die so that the magnetic field sensor can sense a magnetic field produced by current flowing in the current pathway. The magnetic field sensor includes a first magnetic field sensing component galvanically isolated from the current pathway and positioned so that a magnetic field produced by current flowing in the current pathway impinges on the first magnetic field sensing component in a first direction. The magnetic field sensor also includes a second magnetic field sensing component galvanically isolated from the current pathway and positioned so that the magnetic field impinges on the second magnetic field sensing component in a second direction different than the first direction.

20 Claims, 25 Drawing Sheets

(51) Int. Cl.
*H01L 43/06* (2006.01)
*H01L 43/08* (2006.01)
*G01R 33/07* (2006.01)
*G01R 33/09* (2006.01)

SEMICONDUCTOR PACKAGE WITH INTEGRATED MAGNETIC FIELD SENSOR

TECHNICAL FIELD

The present application relates to semiconductor packages, in particular semiconductor packages with integrated magnetic field sensors.

BACKGROUND

Power packages include one or more power semiconductor dies such as power transistor and/or power diode dies attached to a substrate such as a lead frame or ceramic substrate having a patterned metallized surface. In each case, accurate current and/or temperature measurements are needed to ensure reliable and safe operation of the power package. Some current/temperature sensors are implemented using external components such as resistive shunts which are highly precise, but and complicate the package design. Other conventional approaches integrate an electrical-type sensor in the power semiconductor die. This approach reduces the complexity of the package design, but at the expense of reduced precision. Typical integrated electrical-type sensors such as a diode whose voltage is representative of temperature or current have poor sense accuracy e.g. +/−28%. The sense accuracy can be improved e.g. to +/−2% with customer calibration, but this requires calibration effort which increases cost. Some applications run with a defined safety margin or shut down feature in order to avoid over-current/heat and damage of the power semiconductor devices.

SUMMARY

According to an embodiment of a semiconductor package, the semiconductor package comprises a substrate having a plurality of metal leads, a semiconductor die attached to a first one of the leads, and a magnetic field sensor integrated in the same semiconductor package as the semiconductor die and positioned in close proximity to a current pathway of the semiconductor die so that the magnetic field sensor can sense a magnetic field produced by current flowing in the current pathway. For example, the magnetic field sensor can be embedded in the semiconductor die, disposed on the semiconductor die, disposed on one or more of the leads, or disposed over or under a metal clip included in the semiconductor package and which electrically connects one or more of the leads to the semiconductor die or to another one of the leads. The magnetic field sensor is operable to generate a signal in response to a magnetic field produced by current flowing in the current pathway, the magnitude of the signal being proportional to the amount of current flowing in the current pathway.

According to an embodiment of a semiconductor package, the semiconductor package comprises a semiconductor die attached to a substrate and a magnetic field sensor included as part of the same semiconductor package as the semiconductor die and positioned in close proximity to a current pathway of the semiconductor die so that the magnetic field sensor can sense a magnetic field produced by current flowing in the current pathway. The magnetic field sensor comprises a first magnetic field sensing component galvanically isolated from the current pathway and positioned so that a magnetic field produced by current flowing in the current pathway impinges on the first magnetic field sensing component in a first direction. The magnetic field sensor also comprises a second magnetic field sensing component galvanically isolated from the current pathway and positioned so that the magnetic field impinges on the second magnetic field sensing component in a second direction different than the first direction.

According to an embodiment of a method of sensing current in a semiconductor package which includes a semiconductor die attached to a substrate and a magnetic field sensor included as part of the same semiconductor package as the semiconductor die and positioned in close proximity to a current pathway of the semiconductor die so that the magnetic field sensor can sense a magnetic field produced by current flowing in the current pathway, the method comprises: producing a first electrical signal by a first magnetic field sensing component which is galvanically isolated from the current pathway and positioned so that a magnetic field produced by current flowing in the current pathway impinges on the first magnetic field sensing component in a first direction, the first electrical signal being proportional to the magnetic field; producing a second electrical signal by a second magnetic field sensing component which is galvanically isolated from the current pathway and positioned so that the magnetic field impinges on the second magnetic field sensing component in a different than the first direction, the second electrical signal being proportional to the magnetic field; and producing a third electrical signal which is the difference between the first electrical signal and the second electrical signal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide for the integration of a magnetic field sensor such as a magnetoresistive (XMR) sensor or a Hall sensor into a semiconductor package for integrated current and/or temperature measurement. The magnetic field sensor generates a signal in response to a magnetic field produced by current flowing in a current pathway of a semiconductor die included in the package. The magnitude of the signal is proportional to the amount of current flowing in the current pathway, and indicates the current consumption of the semiconductor die and/or temperature of the package. The semiconductor package can be provided with or without galvanic isolation between the magnetic field sensor and the semiconductor die. The magnetic field sensor can be integrated into the same semiconductor package as the semiconductor die for which current and/or temperature measurements are desired, or disposed outside the package on the current carrying connections of the package. For example, the magnetic field sensor can be embedded in the semiconductor die, disposed on the semiconductor die, disposed on one or more of the package leads, or disposed over or under a metal clip included in the semiconductor package for electrically connecting one or more of the leads to the semiconductor die or to another one of the leads. The term 'on' as used herein indicates position in contact or in close proximity with and supported by an exterior surface, or to indicate a source of attachment or support.

Figure 1A:
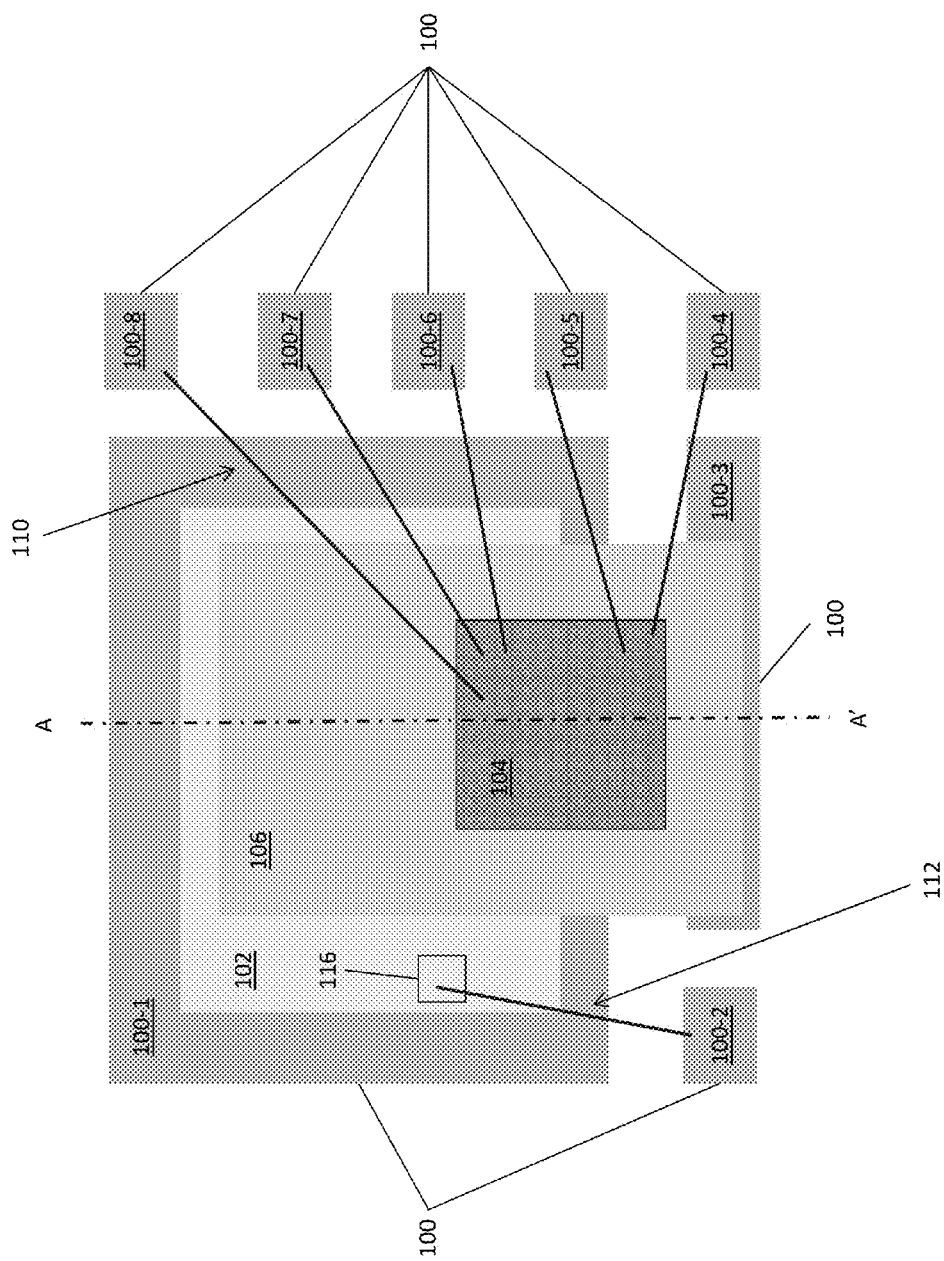
FIG. 1A illustrates a top down plan view of a first embodiment of a semiconductor package having an integrated magnetic field sensor.
Figure 1B:
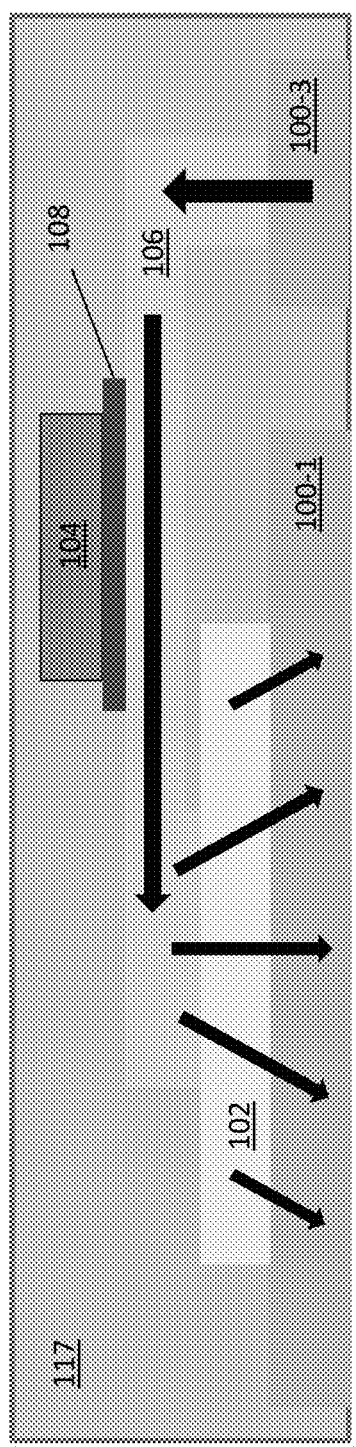
FIG. 1B illustrates a cross-sectional view of the package along the line labeled A-A' in FIG. 1A.

FIG. 1A illustrates a top down plan view of a first embodiment of a semiconductor package, and FIG. 1B illustrates a cross-sectional view of the package along the line labeled A-A' in FIG. 1A. Die attach material and chip metallizations are not shown in FIGS. 1A and 1B for ease of illustration.

The semiconductor package includes a substrate having a plurality of metal leads 100 and a semiconductor die 102 attached to a first one of the leads 100-1. The package can include a single semiconductor die or more than one semiconductor die. Any standard semiconductor package substrate can be used. For example, the substrate can be a lead frame having a die paddle lead 100-1 to which the semiconductor die 102 is attached and a plurality of signal and power leads 100-2 through 100-8 for providing signal and power connections to the semiconductor die 102. In another example, the substrate can be a ceramic-based substrate such as a DCB (direct copper bonded) substrate, AMB (active metal brazed) substrate, or DAB (direct aluminum bonded) substrate in which one or both main sides of a ceramic base have a patterned metallized surface which form the leads 100 for attaching the semiconductor die 102 and providing signal and power connections to the semiconductor die 102. In other examples, the substrate can be a patterned metal substrate, a printed circuit board (PCB), etc. The semiconductor package can be any type of standard semiconductor package having leads 100 for attaching the semiconductor die 102 and providing signal and power connections to the semiconductor die 102. For example, the semiconductor package can be a molded package, an open cavity package with or without a lid, an encapsulated polymer package, a PCB-based package, etc. In each case, the term 'lead' as used herein refers to any insulated electrical conductor physically or electrically connected to an electrical device.

A magnetic field sensor 104 is integrated in the same package as the semiconductor die 102, and positioned in close proximity to a current pathway of the semiconductor die 102 so that the sensor 104 can sense a magnetic field produced by current flowing in the current pathway. According to the embodiment illustrated in FIGS. 1A and 1B, the magnetic field sensor 104 is disposed over a metal clip 106 included in the semiconductor package. The metal clip 106 electrically connects one or more of the leads 100 to the semiconductor die 102. In one case, the metal clip 106 is made of copper. However, the metal clip 106 can be made of other materials. In each case, the magnetic field sensor 104 generates a signal in response to a magnetic field produced by current flowing in a current pathway of the semiconductor die 102. The current pathway is illustrated by arrows in FIG. 1B.

The magnitude of the signal generated by the magnetic field sensor 104 is proportional to the amount of current flowing in the current pathway, and indicates the current consumption of the semiconductor die 102 and/or the temperature of the package. For example in the case of a Hall sensor, a transducer included in the magnetic field sensor 104 varies its output voltage in response to the magnetic field. In the case of a magnetoresistive (XMR) sensor such as an anisotropic magnetoresistive (AMR) sensor, giant magnetoresistive (GMR) sensor or tunnel magnetoresistive (TMR) sensor, the electric resistivity of a metal, semi-metal or semiconductor included in the magnetic field sensor 104 changes under the influence of the magnetic field. The orientation and configuration of the magnetic field sensor 104 can vary according the type of sensor device employed. In each case, the magnitude of the signal generated by the magnetic field sensor 104 is a monotonically dependent response to the amount of current flowing in the current pathway of the semiconductor die 102. As such, current flow through the semiconductor die 102 and temperature within the package can be measured simultaneously.

For example in the case of a power MOSFET die, current flow through the source or drain of the power MOSFET can be measured accurately by positioning the magnetic field sensor 104 in close proximity to the source or drain current pathway of the device. In the case of an IGBT die, current flow through the emitter or collector of the IGBT can be measured accurately by positioning the magnetic field sensor 104 in close proximity to the emitter or collector current pathway of the device. In the case of a power diode die, current flow through the anode or cathode of the power diode can be measured accurately by positioning the magnetic field sensor 104 in close proximity to the anode or cathode current pathway of the device. Even if the signal generated by the magnetic field sensor 104 is nonlinear, it can be corrected e.g. with a microcontroller.

In some applications, the magnetic field sensor 104 may be powered or carry signals at a significantly lower voltage (e.g. 5V) as compared to the semiconductor die 102 (e.g. 500V, 1000V or even higher). For these applications, the magnetic field sensor 104 can be galvanically isolated from the metal clip 106 and therefore from the semiconductor die 102. In one embodiment, the magnetic field sensor 104 is spaced apart from the metal clip 106 by a spacer 108. The spacer 108 can be electrically conductive or electrically insulating. For example, the spacer 108 can be a conductive adhesive, sinter material, solder, etc. for applications in the low to medium voltage range (e.g. up to 500V). In another example, the material of the spacer 108 can be chosen so as to provide galvanic isolation. A conductive adhesive can be used as the spacer 108 in the case the clip voltage and microcontroller has no voltage difference, or the voltage spikes on the clip 106 are blocked by other components. Otherwise, the spacer 108 provides galvanic isolation e.g. with nonconductive glue. The thickness of the glue influences the response of the magnetic field sensor 104 and the galvanic isolation level. The spacer material and dimensions can be selected to optimize minimal detected current, maximal detected current and galvanic isolation level.

The thickness of the spacer 108 can be chosen so that the strength of the magnetic field which enters the magnetic field sensor 104 is reduced to a non-destructive level. A relatively thick spacer is particularly advantageous for high current applications. In one embodiment, the spacer 108 is a semiconductor die such as a silicon die interposed between the magnetic field sensor 104 and the metal clip 106. In other embodiments, the spacer 108 can be a polymer, ceramic, non-conductive adhesive, non-conductive film, or any other single or multi-layer material which separates the magnetic field sensor 104 from the metal clip 106. Alternatively, the magnetic field sensor 104 can be directly attached to the metal clip 106 e.g. by solder if the sensor 104 has a solderable backside or by a non-electrically conductive adhesive.

Electrical connections can be made to the magnetic field sensor by electrical conductors 110 such as wire bonds, wire ribbons, etc. which are attached at one end to the magnetic field sensor 104 and at the opposing end to one or more of the package leads 100. An additional electrical conductor 112 electrically connects a separate pad 114 on the topside of the semiconductor die 102 to a corresponding package lead 100-2 e.g. to form a gate connection for a transistor die. The metal clip 106 can provide the drain (MOSFET) or collector (IGBT) connection in the case of a power transistor, or the anode or cathode connection in the case of a power diode. An electrical connection to the backside of the semiconductor die 102 is provided by the package lead 100-1 attached to this side of the die 102. This electrical connection can be the source (MOSFET) or emitter (IGBT) connection in the case of a power transistor, or the cathode or anode connection in the case of a power diode.

The semiconductor package can be molded or encapsulated with a non-conductive material 117 such as a mold compound, adhesive, silicone, silicone gel, etc. The non-conductive material 117 is not shown in FIG. 1A for ease of illustration. In addition to the reliability provided by such a mold/encapsulant 117, the dielectric properties of the mold/encapsulant 117 also ensure good electrical insulation between the sensor 104 which operates at a relatively low voltage (e.g. 5V) and the semiconductor die 102 which operates at a relatively high voltage (e.g. several hundred or thousands of volts).

Figure 2:
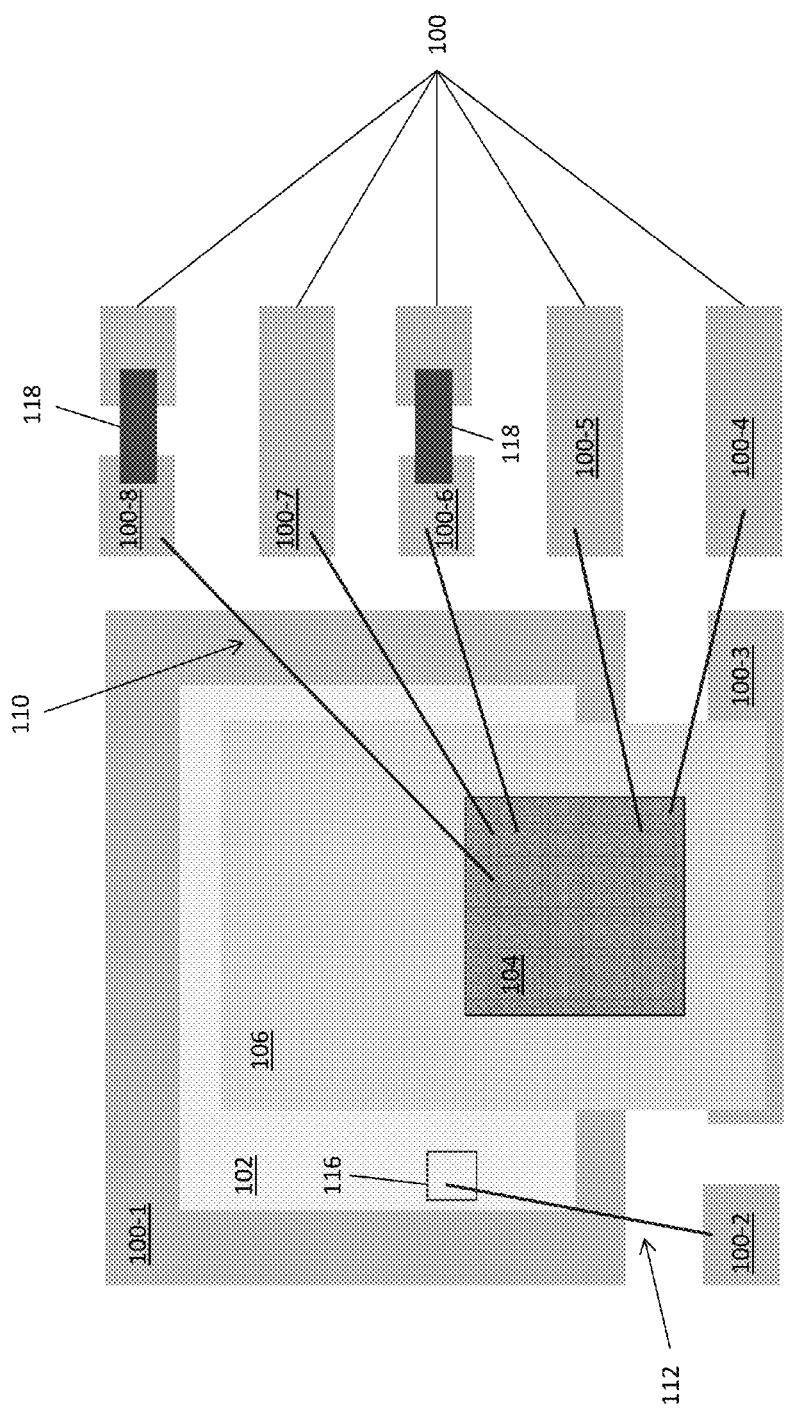
FIG. 2 illustrates a top down plan view of a second embodiment of a semiconductor package having an integrated magnetic field sensor.

FIG. 2 illustrates a top down plan view of a second embodiment of the semiconductor package. The embodiment shown in FIG. 2 is similar to the embodiment shown in FIGS. 1A and 1B. Different, however, passive components 118 such as resistors and/or capacitors which comprise part of the sensing circuit that includes the magnetic field sensor 104 are also integrated in the same package as the sensor 104 and the semiconductor die 102. The passive components 118 are attached to different ones of the package leads 100. Electrical conductors 110 such as wire bonds, wire ribbons, etc. electrically connect the passive components 118 to the magnetic field sensor 104.

Figure 3:
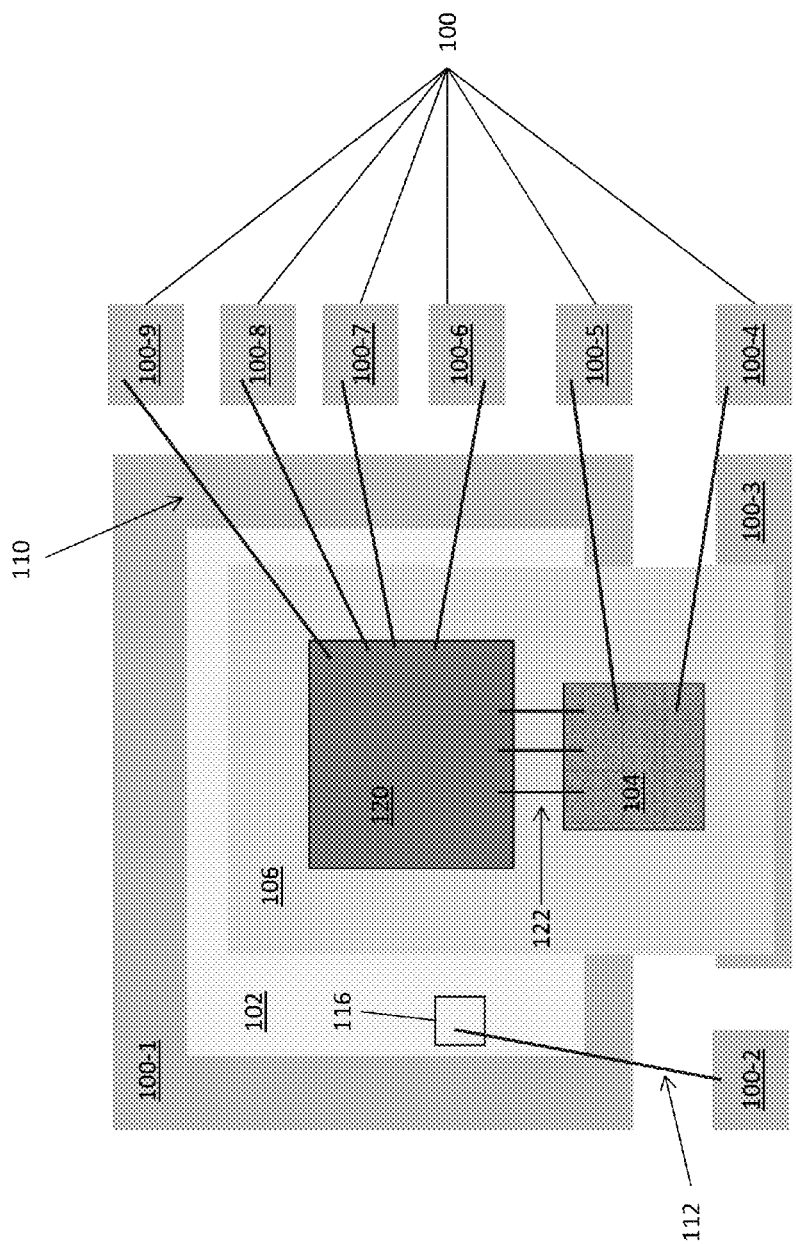
FIG. 3 illustrates a top down plan view of a third embodiment of a semiconductor package having an integrated magnetic field sensor.

FIG. 3 illustrates a top down plan view of a third embodiment of the semiconductor package. The embodiment shown in FIG. 3 is similar to the embodiment shown in FIGS. 1A and 1B. Different, however, a logic device 120 for controlling the magnetic field sensor 104 is attached to the same metal clip 106 on which the sensor 104 is disposed. Any standard logic device such as a microcontroller, ASIC (application-specific integrated circuit), etc. capable of controlling operation of the magnetic field sensor 104 can be used. Electrical conductors 110 such as wire bonds, wire ribbons, etc. electrically connect the logic device 120 to one or more leads of the package to provide electrical connections to the logic device. Additional electrical conductors 122 such as wire bonds, wire ribbons, etc. electrically connect the logic device 120 to the magnetic field sensor 104.

Figure 4:
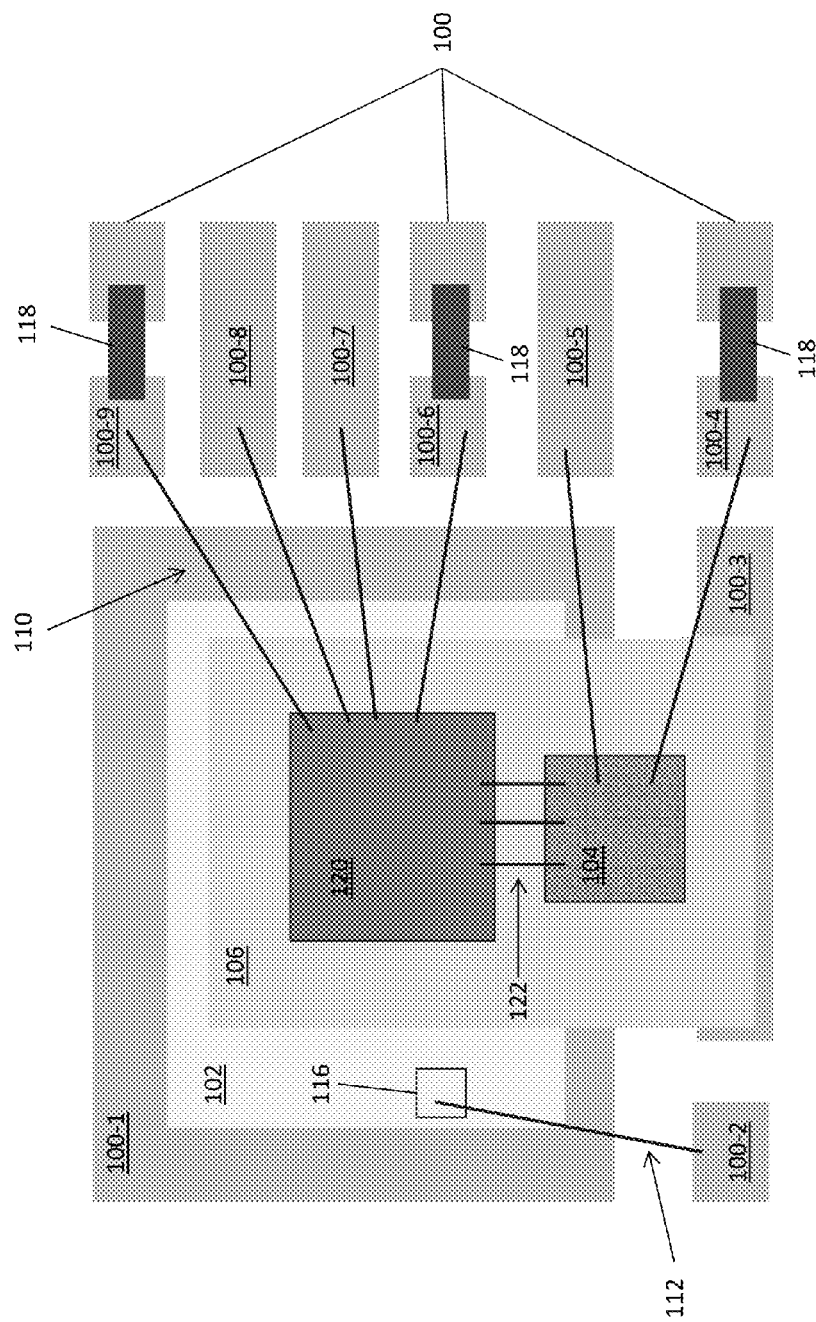
FIG. 4 illustrates a top down plan view of a fourth embodiment of a semiconductor package having an integrated magnetic field sensor.

FIG. 4 illustrates a top down plan view of a fourth embodiment of the semiconductor package. The embodiment shown in FIG. 4 is similar to the embodiment shown in FIG. 3. Different, however, passive components 118 such as resistors and/or capacitors which comprise part of the sensing circuit that includes the logic device 120 and the magnetic field sensor 104 are also integrated in the same package as the sensor 104, logic device 120 and semiconductor die 102. The passive components 118 are attached to different ones of the package leads 100. Electrical conductors 110 such as wire bonds, wire ribbons, etc. electrically connect the passive components 118 to the logic device 120 and/or the magnetic field sensor 104. As such, the passive components 118 are electrically connected to the magnetic field sensor 104 and the logic device 120 to form the desired sensing circuit.

Figure 5:
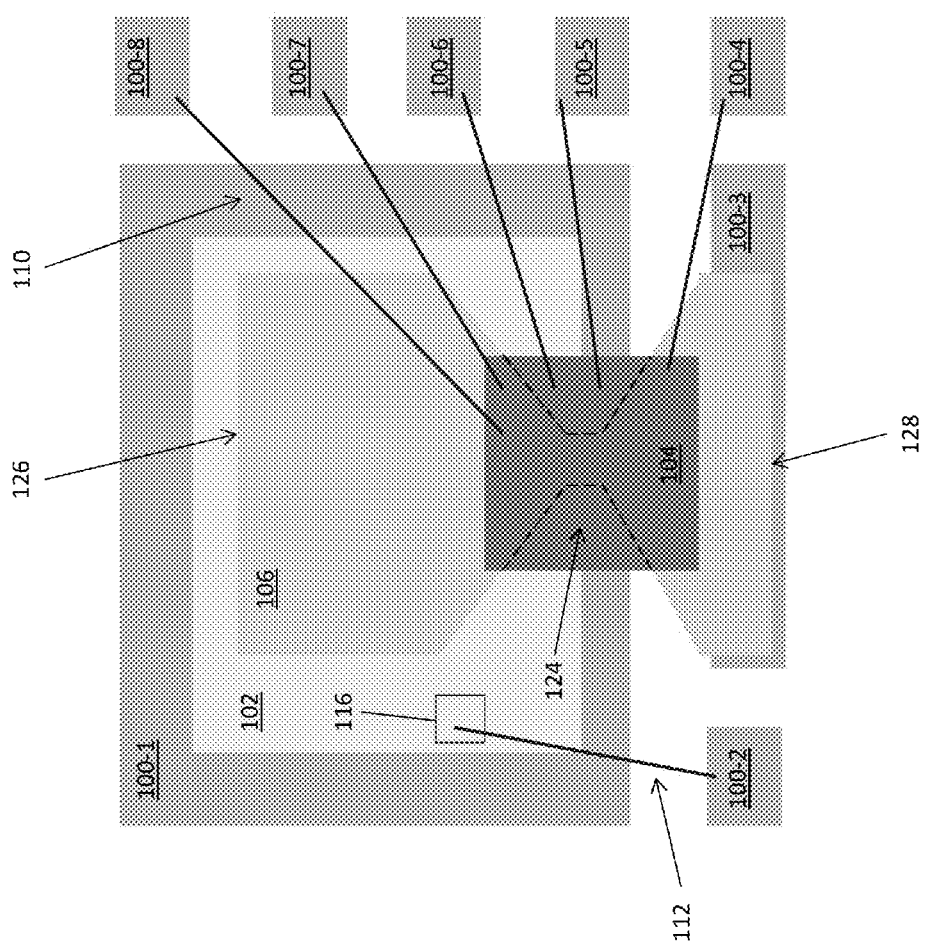
FIG. 5 illustrates a top down plan view of a fifth embodiment of a semiconductor package having an integrated magnetic field sensor.

FIG. 5 illustrates a top down plan view of a fifth embodiment of the semiconductor package. The embodiment shown in FIG. 5 is similar to the embodiment shown in FIGS. 1A and 1B. Different, however, the metal clip 106 has a tapered region 124 for which the width of the metal clip 106 reduces to less or equal than the width of the magnetic field sensor 104 and the sensor 104 is positioned over the tapered region 124. The tapered region 124 is interposed between wider opposing end regions 126, 128 of the metal clip 106. The portion of the tapered region 124 disposed under the magnetic field sensor 104 and having a narrower width than the sensor 104 is shown in dashed lines in FIG. 5 since this section of the tapered region 124 is covered by the magnetic field sensor 104 and therefore out of view.

Figure 6:
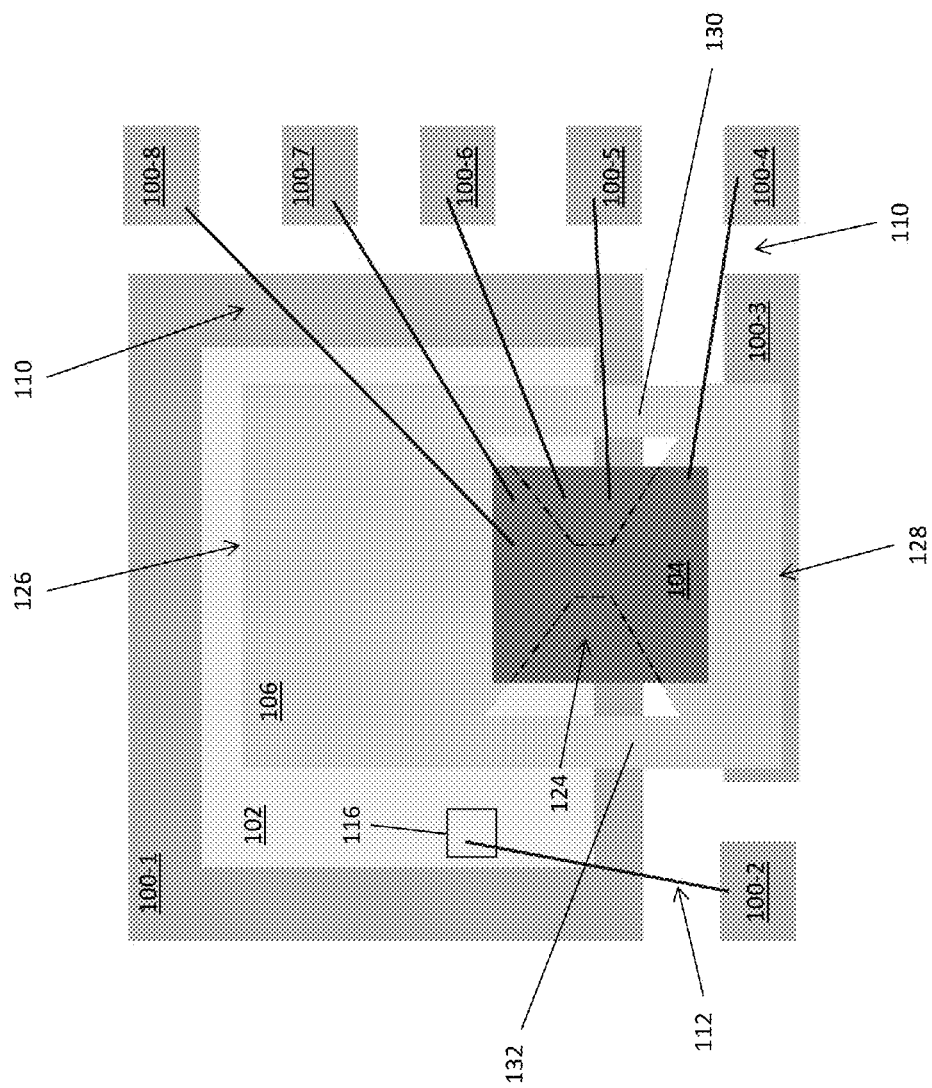
FIG. 6 illustrates a top down plan view of a sixth embodiment of a semiconductor package having an integrated magnetic field sensor.

FIG. 6 illustrates a top down plan view of a sixth embodiment of the semiconductor package. The embodiment shown in FIG. 6 is similar to the embodiment shown in FIG. 5. Different, however, the metal clip 106 further includes lateral branches 130, 132 which extend in parallel with the tapered region 124 between the opposing end regions 126, 128. The lateral branches 130, 132 are spaced apart from the tapered region 124 and uncovered by the magnetic field sensor 104. The addition of the lateral branches 130, 132 allows the metal clip 106 to handle more current than the clip configuration illustrated in FIG. 5. However, additional calibration effort and offset values may be needed since the entire current pathway does not run under the magnetic field sensor 104. As such, the magnetic field sensed by the magnetic field sensor 104 does not represent the total current flowing though the pathway but instead only the portion of the current flowing under the sensor 104.

Figure 7:
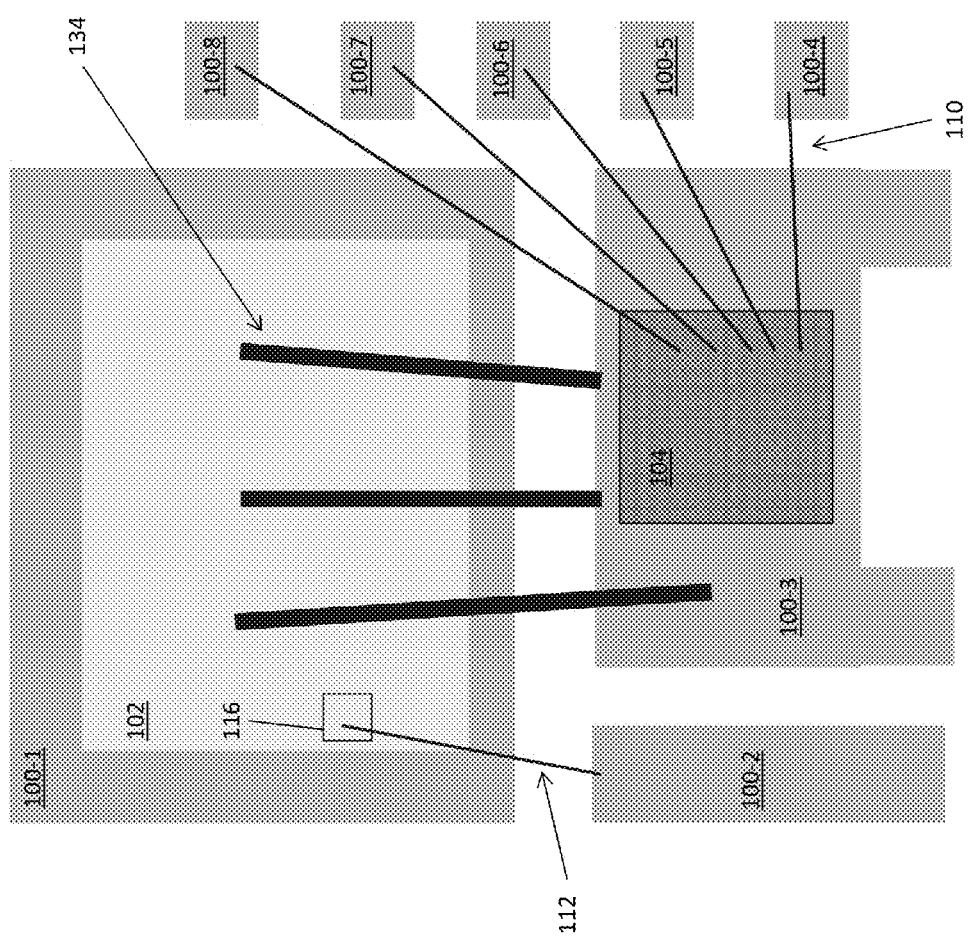
FIG. 7 illustrates a top down plan view of a seventh embodiment of a semiconductor package having an integrated magnetic field sensor.

FIG. 7 illustrates a top down plan view of a seventh embodiment of the semiconductor package. The embodiment shown in FIG. 7 is similar to the embodiment shown in FIGS. 1A and 1B. Different, however, the magnetic field sensor 104 is disposed on a package lead 100-3 different than the lead 100-1 to which the semiconductor die 102 is attached. The lead 100-3 on which the magnetic field sensor 104 is disposed provides an electrical connection to the semiconductor die 102 through one or more electrical conductors 134 such as wire bonds, wire ribbons, etc. One or more of these electrical conductor(s) 134 are interposed between the semiconductor die 102 and the magnetic field sensor 104. The magnetic field sensor 104 is operable to sense the magnetic field produced by current flowing in the current pathway realized by the lead 100-3 on which the magnetic field sensor 104 is disposed and each electrical conductor 134 connected to this lead 100-3 and interposed between the semiconductor die 102 and the magnetic field sensor 104.

Figure 8:
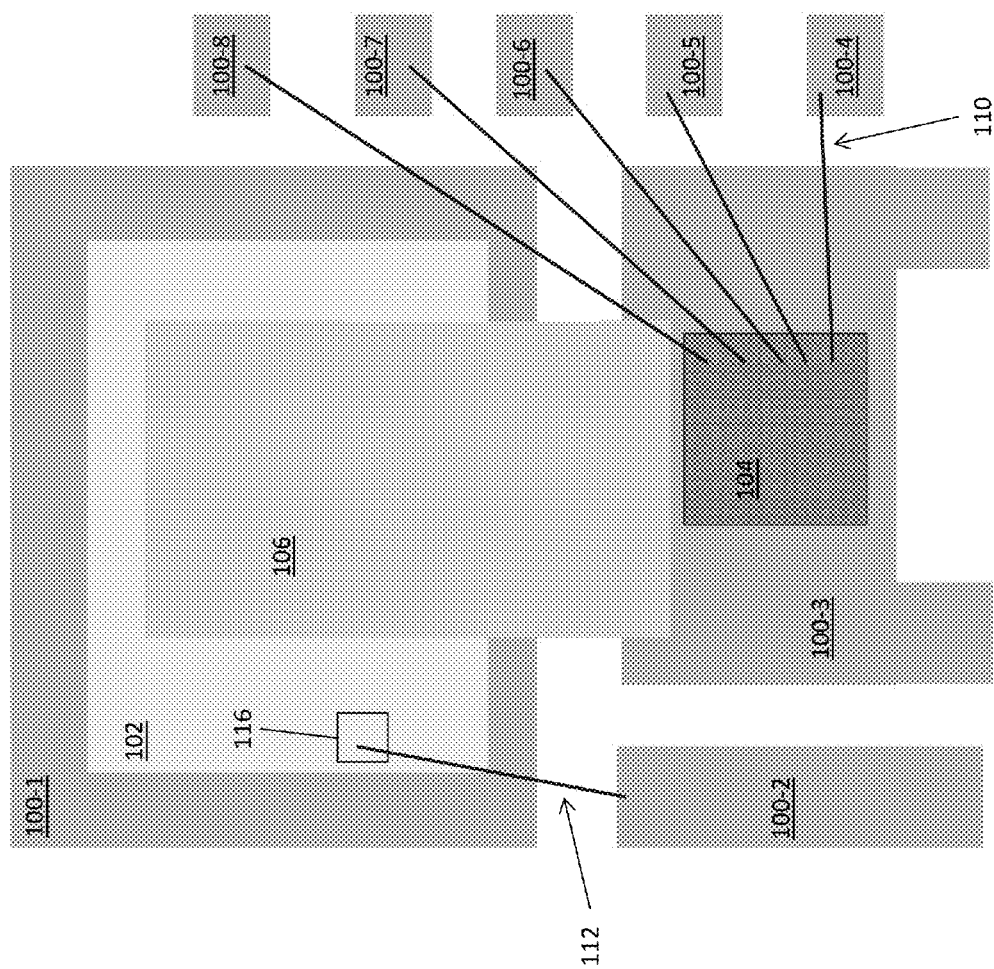
FIG. 8 illustrates a top down plan view of an eighth embodiment of a semiconductor package having an integrated magnetic field sensor.

FIG. 8 illustrates a top down plan view of an eighth embodiment of the semiconductor package. The embodiment shown in FIG. 8 is similar to the embodiment shown in FIG. 7. Different, however, the electrical connection between the lead 100-3 on which the magnetic field sensor 104 is disposed and the semiconductor die 102 is provided by a metal clip 106 instead of wire bonds or ribbons. The magnetic field sensor 104 is operable to sense the magnetic field produced by current flowing in the current pathway realized by the lead 100-3 on which the magnetic field sensor 104 is disposed and the metal clip 106 which electrically connects this lead 100-3 to the semiconductor die 102.

Figure 9A:
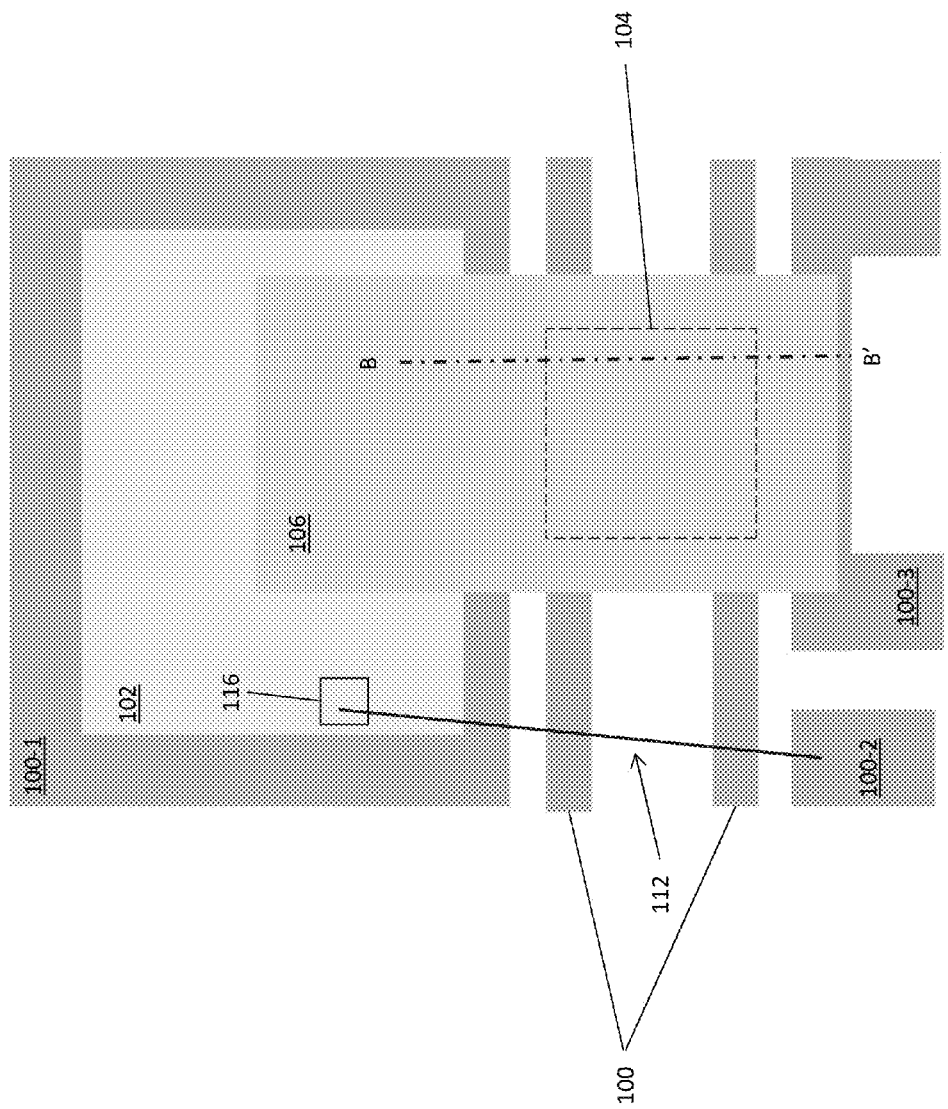
FIG. 9A illustrates a top down plan view of a ninth embodiment of a semiconductor package having an integrated magnetic field sensor.
Figure 9B:
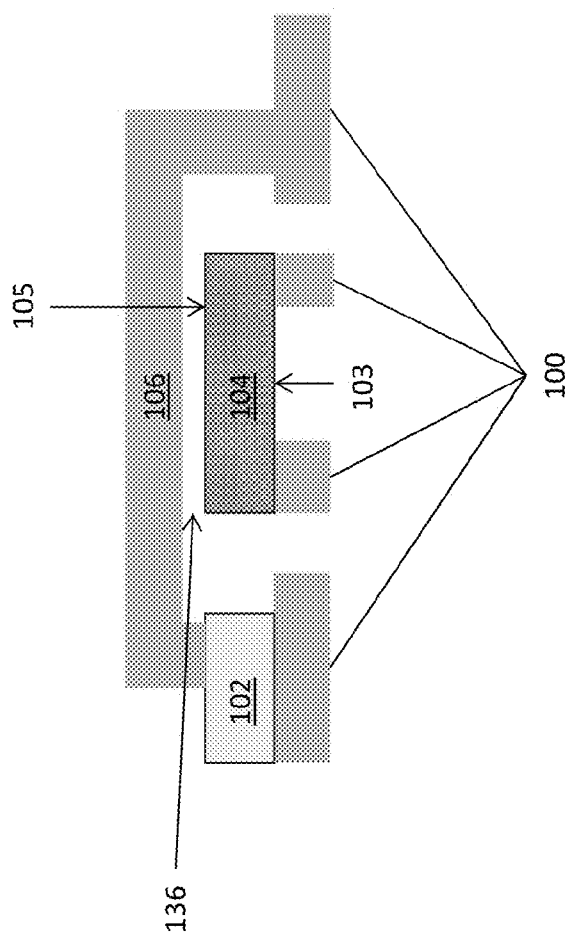
FIG. 9B illustrates a cross-sectional view of the package along the line labeled B-B' in FIG. 9A.

FIG. 9A illustrates a top down plan view of a ninth embodiment of the semiconductor package, and FIG. 9B illustrates a cross-sectional view of the package along the line labeled B-B' in FIG. 9A. The embodiment shown in FIGS. 9A and 9B is similar to the embodiment shown in FIGS. 1A and 1B. Different, however, the magnetic field sensor 104 is disposed under a metal clip 106 which electrically connects one of the package leads 100-3 to the semiconductor die 102. The magnetic field sensor 104 is shown as a dashed box in FIG. 9A because the sensor 104 is covered by the metal clip 106 in this view. One or more of the package leads 100 extend under the metal clip 106 to provide electrical connections at the backside 103 of the magnetic field sensor 104. Mechanical contact between the topside 105 of the magnetic field sensor 104 and the overlying metal clip 106 is not necessary, because the sensor 104 is supported by one or more of the underlying package lead(s) 110. The topside 105 of the magnetic field sensor 104 can be galvanically isolated from the overlying metal clip 106 by e.g. an air gap 136. In addition or alternatively, a spacer (not shown in FIG. 9B) can separate the magnetic field sensor 104 from the metal clip 106 e.g. as shown in FIG. 1B. For example, the gap 136 can be filled with some kind of polymer such as mold compound, non-conductive adhesive or non-conductive film/tape. Alternatively, a conductive material can fill the gap 136 between the sensor 104 and the overlying metal clip 106 in the case of low voltage devices. Different than FIG. 1B, the spacer would be interposed between the topside 105 of the magnetic field sensor 104 and the overlying metal clip 106.

Figure 10:
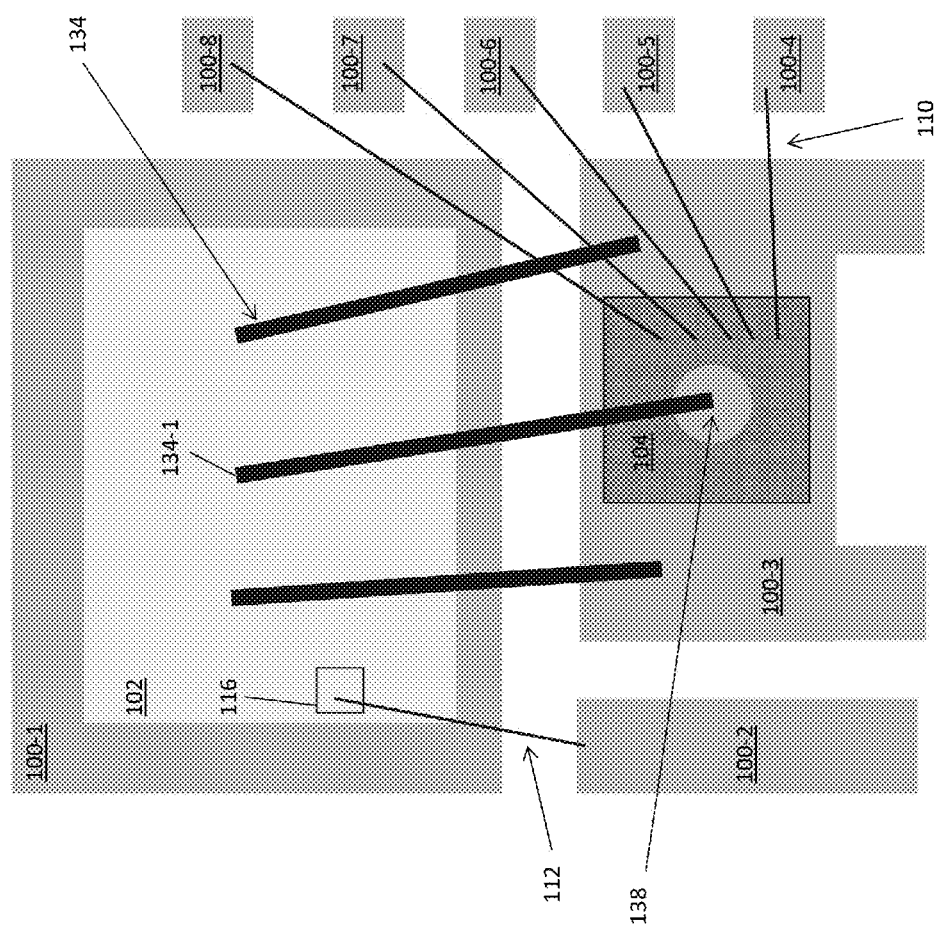
FIG. 10 illustrates a top down plan view of a tenth embodiment of a semiconductor package having an integrated magnetic field sensor.

FIG. 10 illustrates a top down plan view of a tenth embodiment of the semiconductor package. The embodiment shown in FIG. 10 is similar to the embodiment shown in FIG. 7. Different, however, the magnetic field sensor 104 has an opening 138 extending through the sensor 104. Various semiconductor technologies readily enable the formation of such an opening 138 e.g. by masking and chemical etching processes, laser drilling processes, etc., and therefore no further explanation is provided in this regard. At least one electrical conductor 134-1 is attached to the lead 100-3 on which the magnetic field sensor 104 is disposed, through the opening 138 in the sensor 104. The other end of this lead 134-1 is attached to the semiconductor die 102 to complete the corresponding electrical connection. The magnetic field sensor 104 is operable to sense the magnetic field produced by current flowing in the current pathway realized by the lead 100-3 on which the magnetic field sensor 104 is disposed and the electrical conductor 134-1 attached to this lead 100-3 through the opening 138 in the magnetic field sensor 104.

Figure 11A:
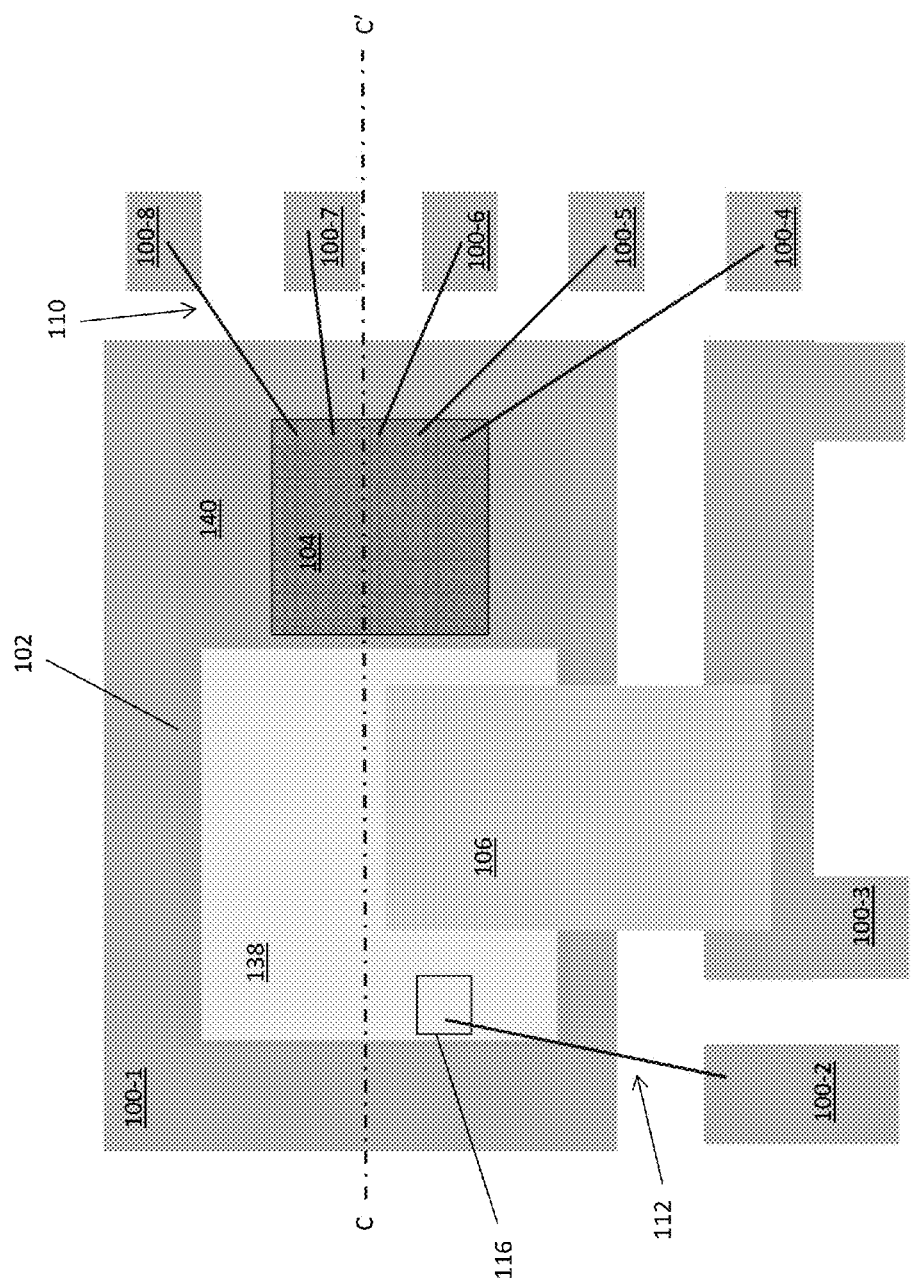
FIG. 11A illustrates a top down plan view of an eleventh embodiment of a semiconductor package having an integrated magnetic field sensor.
Figure 11B:
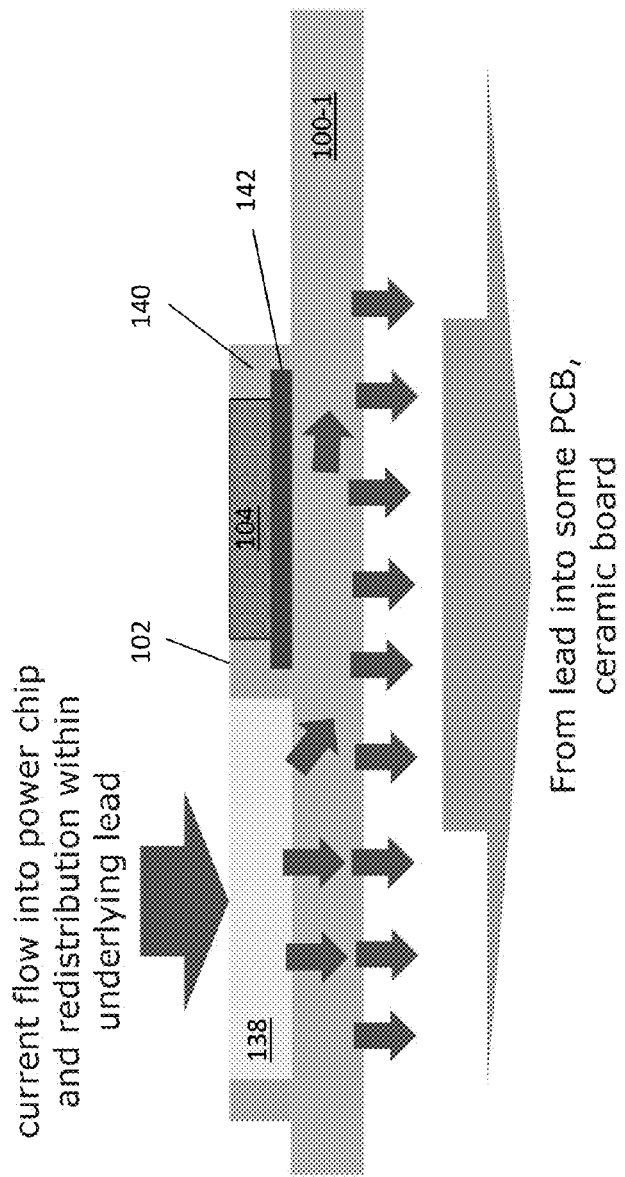
FIG. 11B illustrates a cross-sectional view of the package along the line labeled C-C' in FIG. 11A.

FIG. 11A illustrates a top down plan view of an eleventh embodiment of the semiconductor package, and FIG. 11B illustrates a cross-sectional view of the package along the line labeled C-C' in FIG. 11A. The embodiment shown in FIGS. 11A and 11B is similar to the embodiment shown in FIGS. 1A and 1B. Different, however, the magnetic field sensor 104 is embedded in the same die 102 as the power semiconductor device(s) 140. The die 102 includes a semiconductor body 140 comprising Si or a compound semiconductor such as SiC, GaAs, GaN, etc. The power device(s) 138 are formed in the semiconductor body 140. The magnetic field sensor 104 is disposed in the same semiconductor body 140 as the power device(s) 138, but galvanically isolated from the power device(s) 138. The galvanic isolation 142 can be integrated in the semiconductor body 140, or as part of a bondline with the underlying package lead 100-1. In each case, the current flow pathway into the power device(s) 138 and out of the power device(s) 138 to some PCB, ceramic substrate, etc. (not shown) is illustrated in FIG. 11B by a series of arrows. As shown in FIG. 11B, some of the current spreads out under the magnetic field sensor 104 in the lead 100-1 to which the die 102 is attached. The magnetic field produced by the current flowing in this part of the lead 100-1 is sensed by the integrated magnetic field sensor 104. The magnitude of the corresponding signal generated by the sensor 104 is proportional to the amount of current flowing in this part of the current pathway. The metal clip 106 shown in FIG. 11A can be replaced by a different type of electrical conductor such as wire bonds, wire ribbons, etc.

Figure 12:
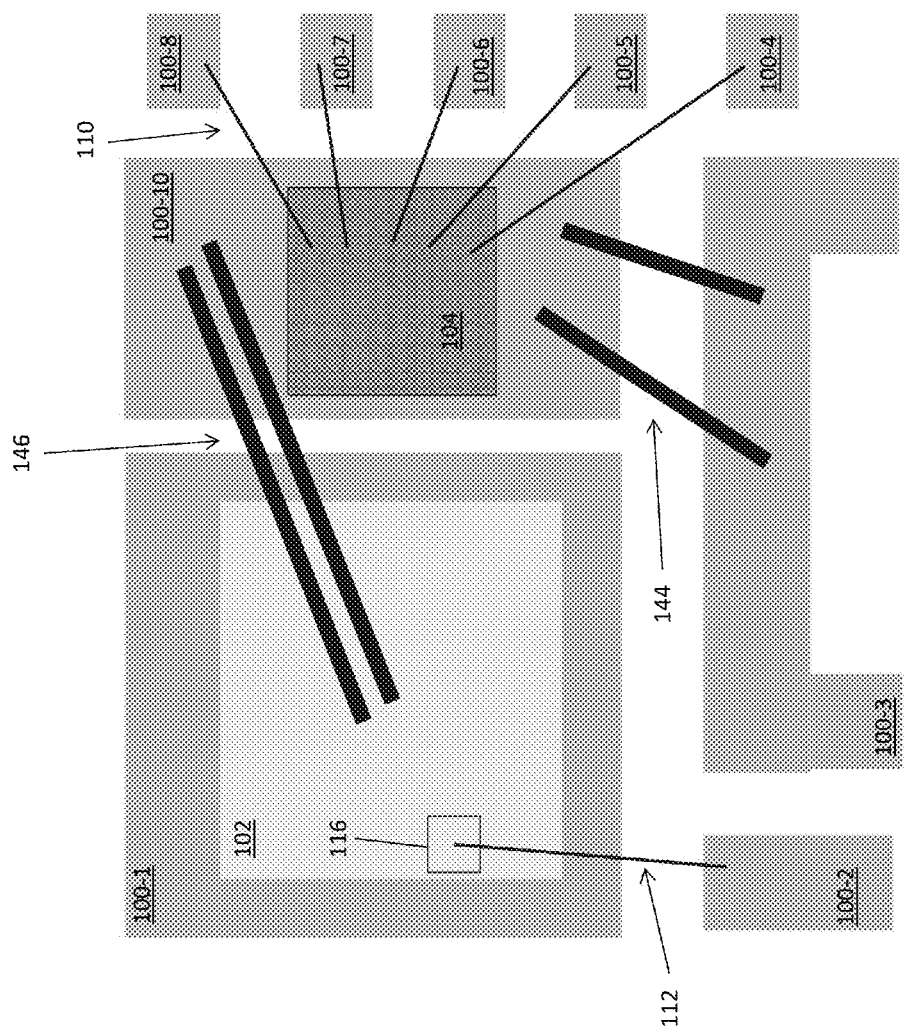
FIG. 12 illustrates a top down plan view of a twelfth embodiment of a semiconductor package having an integrated magnetic field sensor.

FIG. 12 illustrates a top down plan view of a twelfth embodiment of the semiconductor package. The embodiment shown in FIG. 12 is similar to the embodiment shown in FIG. 7. Different, however, the magnetic field sensor 104 is disposed on a third lead 100-10. A first set 144 of one or more electrical conductors such as wire bonds, wire ribbons, etc. each have a first end attached to a second lead 100-3 and a second end attached to the third lead 100-10. A second set 146 of one or more electrical conductors such as wire bonds, wire ribbons, etc. each have a first end attached to the third lead 100-10 and a second end attached to the semiconductor die 102 which is attached to a first lead 100-1. The magnetic field sensor 104 is interposed between the first set 144 and the second set 146 of one or more electrical conductors, and senses the magnetic field produced by the current flowing from the first set 144 of one or more electrical conductors to the second set 146 of one or more electrical conductors through the third lead 100-10.

Figure 13A:
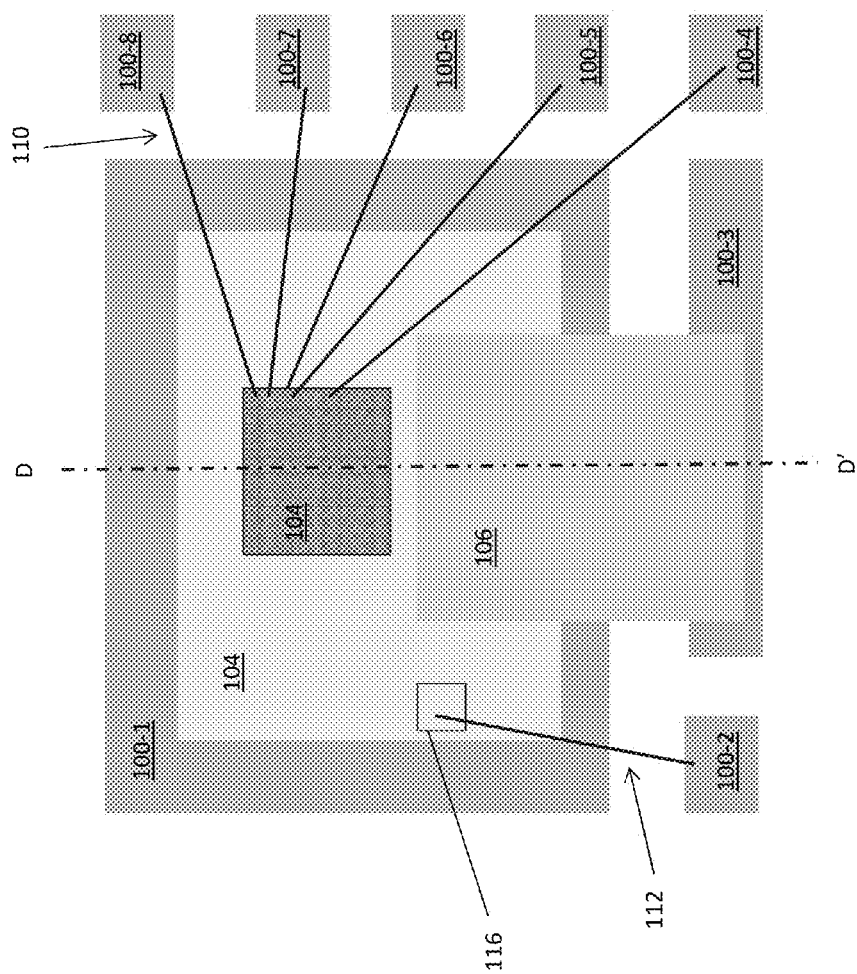
FIG. 13A illustrates a top down plan view of a thirteenth embodiment of a semiconductor package having an integrated magnetic field sensor.
Figure 13B:
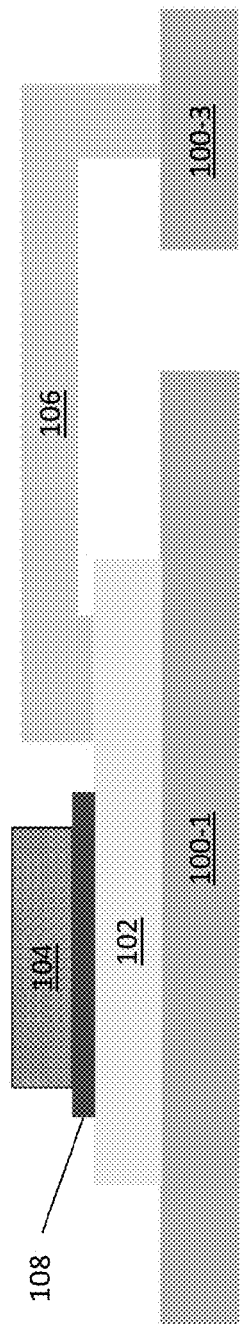
FIG. 13B illustrates a cross-sectional view of the package along the line labeled D-D' in FIG. 13A.

FIG. 13A illustrates a top down plan view of a thirteenth embodiment of the semiconductor package, and FIG. 13B illustrates a cross-sectional view of the package along the line labeled D-D' in FIG. 13A. The embodiment shown in FIGS. 13A and 13B is similar to the embodiment shown in FIGS. 1A and 1B. Different, however, the magnetic field sensor 104 is disposed on the semiconductor die 102 instead of the metal clip 106 which electrically connects the corresponding package lead 100-3 to the semiconductor die 102. The magnetic field sensor 104 is galvanically isolated from the semiconductor die 102. In one embodiment, a spacer 108 separates the magnetic field sensor 104 from the semiconductor die 102. The spacer 108 can provide both galvanic isolation and magnetic field reduction at the sensor 104 as previously described herein.

The embodiments described above position the magnetic field sensor such that the magnetic field strength of interest is measured in only one direction. With such a sensor configuration, additional signal processing must be performed to suppress the influence of stray magnetic fields such as the earth's magnetic field on the measurement results. Accordingly, current measurement information derived from the sensor output can include contributions attributable to stray magnetic fields which impinge on the magnetic field sensor, making the current measurement information less accurate if not further processed to cancel out these contributions. The embodiments described below use a differential measuring method where the magnetic field sensor comprises at least two magnetic field sensor components positioned so that the magnetic field of interest impinges on the magnetic field sensor components in different directions, allowing to more easily suppress the influence of stray magnetic fields such as the earth's field on the measurement results.

The magnitude of the signal generated by each magnetic field sensor component is proportional to the amount of current flowing in the current pathway, and indicates the current consumption of the semiconductor die and/or the temperature of the package. For example in the case of a Hall sensor, at least two transducers can be positioned so that the magnetic field of interest (vertically) impinges on the transducers in different vertical directions. Each transducer varies its output voltage in response to the magnetic field. In the case of magnetoresistive (XMR) sensor components such as anisotropic magnetoresistive (AMR) sensor components, giant magnetoresistive (GMR) sensor components or tunnel magnetoresistive (TMR) sensor components, the electric resistivity of a metal, semi-metal or semiconductor included in the XMR sensor components changes under the influence of the magnetic field which impinges (laterally) on the XMR sensor components in different lateral directions.

The orientation and configuration of the magnetic field sensor components can vary according the type of magnetic field sensor employed. For example, the magnetic field sensor components can be one-dimensional XMR or Hall devices in that they measure just the magnetic field intensity or can be three-dimensional devices which also output an electrical signal which is proportional to the distance between the current pathway and the three-dimensional magnetic field sensing component. In each case, the magnitude of the signal generated by each magnetic field sensor component is proportional to the amount of current flowing in the current pathway of the semiconductor die. However, the magnetic field sensor components are positioned so that the magnetic field of interest impinges on the magnetic field sensor components in different directions, allowing for the influence of stray magnetic fields such as the earth's field to be suppressed e.g. by taking the difference of the sensor component electrical signal outputs. As such, current flow through the semiconductor die and temperature within the package can be measured more accurately.

Figure 14A:
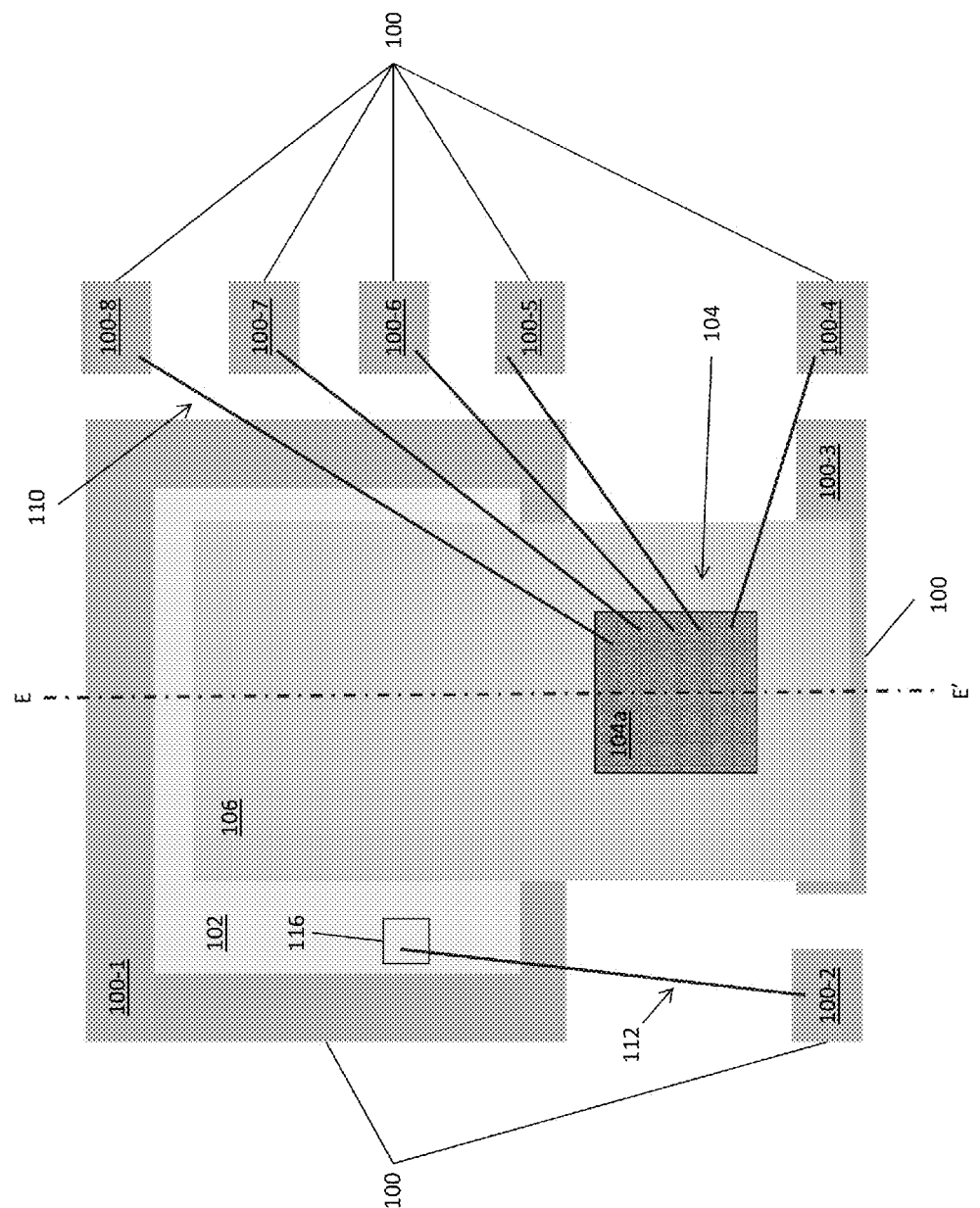
FIG. 14A illustrates a top down plan view of a fourteenth embodiment of a semiconductor package having an integrated magnetic field sensor.
Figure 14B:
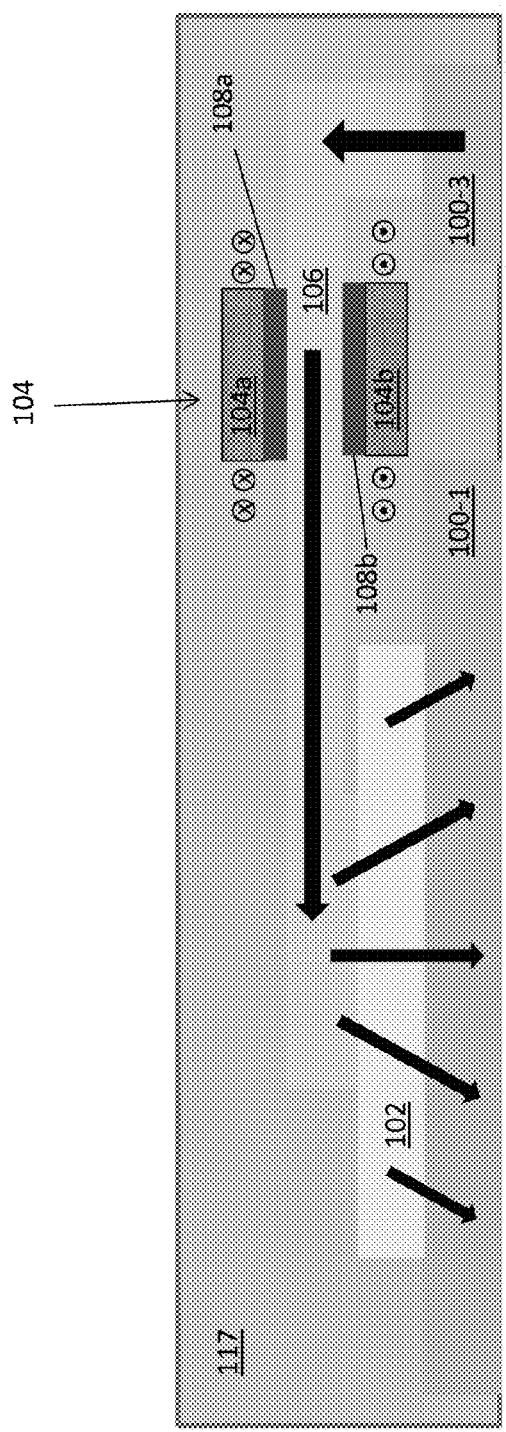
FIG. 14B illustrates a cross-sectional view of the package along the line labeled E-E' in FIG. 14A.

FIG. 14A illustrates a top down plan view of a fourteenth embodiment of the semiconductor package, and FIG. 14B illustrates a cross-sectional view of the package along the line labeled E-E' in FIG. 14A. The embodiment shown in FIGS. 14A and 14B is similar to the embodiment shown in FIGS. 1A and 1B. Different, however, the magnetic field sensor 104 comprises a first magnetic field sensing component 104a and a second magnetic field sensing component 104b. The second magnetic field sensing component 104b is covered by metal clip 106 and therefore out of view in FIG. 14A.

The first magnetic field sensing component 104a is adjacent the top side of metal clip 106 and galvanically isolated from the current pathway. The second magnetic field sensing component 104b is adjacent the bottom side of metal clip 106 and also galvanically isolated from the current pathway. The first and the second magnetic field sensing components 104a, 104b of the magnetic field sensor 104 are disposed in separate semiconductor dies according to this embodiment, because the sensor components 104a, 104b are adjacent opposite sides of the same metal clip 106. In one embodiment, a spacer 108a, 108b separates each magnetic field sensor component 104a, 104b from the metal clip 106. The spacer 108 can provide both galvanic isolation and magnetic field reduction at each sensor component 104a, 104b as previously described herein. The metal clip 106 electrically connects a lead 100-3 of the semiconductor package to a terminal (e.g. emitter or source terminal) of the semiconductor die 102.

With the sensor component configuration shown in FIGS. 14A and 14B, the first magnetic field sensing component 104a is positioned so that the magnetic field produced by current flowing in the current pathway impinges on the first magnetic field sensing component 104a in a first direction. The second magnetic field sensing component 104b is positioned so that the magnetic field impinges on the second magnetic field sensing component 104b in a second direction different than the first direction. The current pathway is illustrated by arrows in FIG. 14B.

Current enters lead 100-3, traverses metal clip 106 from right to left, enters the semiconductor die 102 and exits the package through lead 100-1. FIG. 14B illustrates a few vectors of the resulting magnetic field entering the page above the metal clip 106 by symbol ⊗ and a few vectors of the magnetic field exiting the page below the metal clip 106 by symbol ⊙. As such, the magnetic field of interest, i.e. the magnetic field produced by current flowing in the current pathway, impinges on the first and the second magnetic field sensing components 104a, 104b in opposite directions in this embodiment.

The magnetic field sensor 104 produces an electrical signal which is proportional to the sensed magnetic field. The electrical signal comprises a first signal component output by the first magnetic field sensing component 104a and a second signal component output by the first magnetic field sensing component. The difference of the electrical signals output by the magnetic field sensing components 104a, 104b suppresses (cancels in this case) the influence of stray magnetic fields because any stray magnetic fields that impinge on the magnetic field sensing components 104a, 104b do so in the same direction with the sensor component configuration shown in FIGS. 14A and 14B. The magnetic field of interest impinges on the magnetic field sensing components 104a, 104b in opposite directions with the sensor component configuration shown in FIGS. 14A and 14B, and therefore the measured magnitude of the magnetic field of interest is constructively combined to yield an accurate estimate of the current flowing in the current pathway without being influenced by stray magnetic fields.

Figures 15A, 15B:
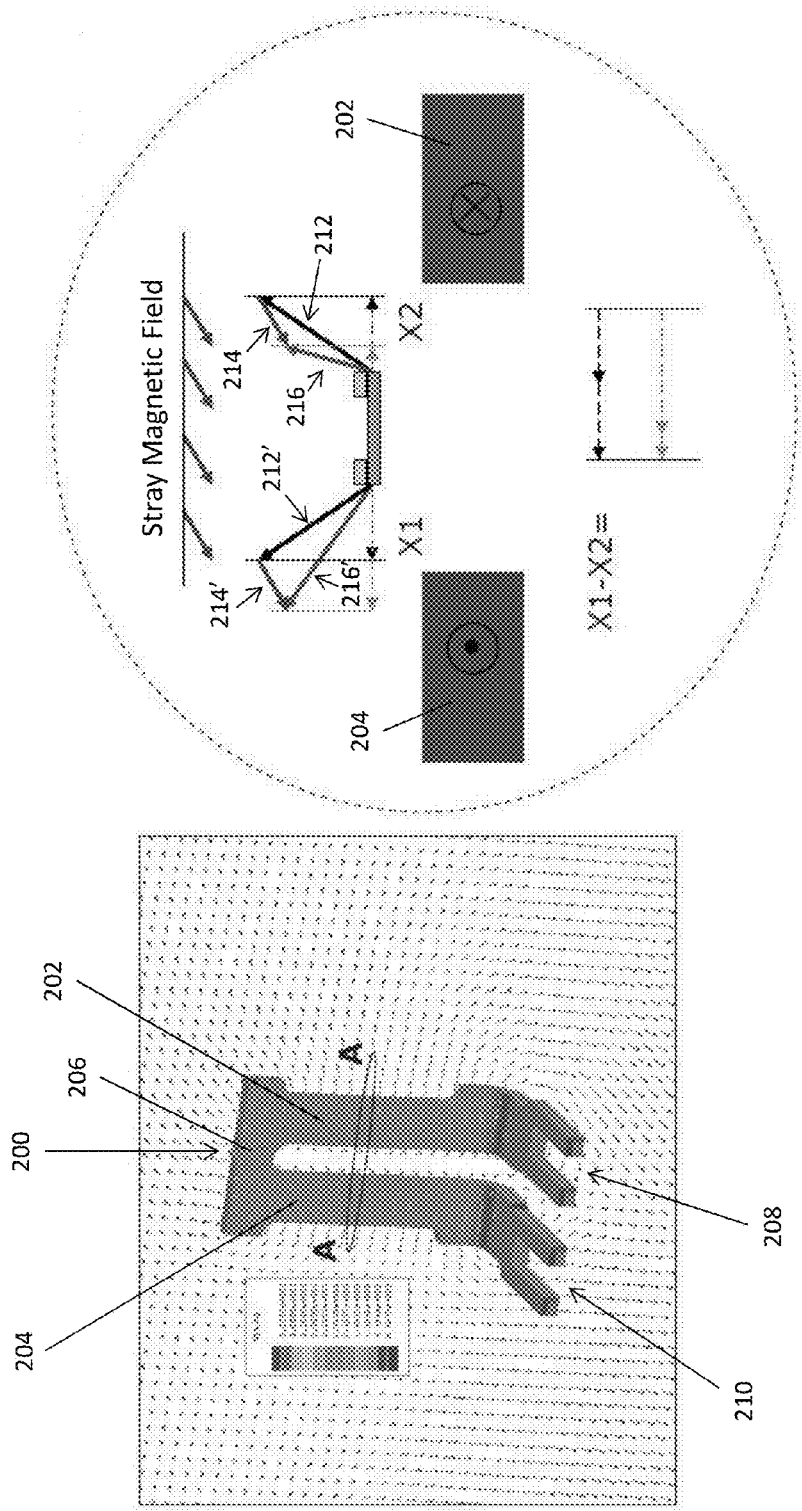
FIG. 15A illustrates vectors of a magnetic field produced by current flowing through a U-shaped metal clip.
FIG. 15B illustrates a sectional view of the U-shaped metal clip shown in FIG. 15A along the line labelled A-A.

FIG. 15A illustrates vectors of a magnetic field produced by current flowing through a metal clip 200 having a first section 202 and a second section 204 which are spaced apart from each other and extend in parallel with one another as part of the current pathway. A third section 206 extends perpendicular between the first and the second sections 202, 204, and connects the first section 202 to the second section 204. The ends 208, 210 of the first and the second sections 202, 204 are not connected physically to one another. Current flowing in the metal clip 200 enters one end 208 and exits the other end 210. The current flows in the opposite direction in the first section 202 as compared to the second section 204. As a result, the magnetic field produced by the current flowing in the metal clip 200 propagates outward from the first section 202 in the opposite direction as compared to the second section 204.

FIG. 15B illustrates a sectional view of the metal clip 200 shown in FIG. 15A along the line labeled A-A. Current flows in one direction in the first section 202 of the metal clip 200 as represented by symbol ⊗ in FIG. 15B, and flows in the opposite direction in the second section 204 of the metal clip 200 as represented by symbol ⊙ in FIG. 15B. Also shown in FIG. 15B is a stray magnetic field which impinges on each section 202, 204 of the metal clip 200 in the same direction.

FIG. 15B also shows a first vector 212, 212' representing the magnetic field of interest, a second vector 214, 214' representing the stray magnetic field and a third vector 216, 216' representing the combination of the first and second vectors measured for the first and the second sections 202, 204 of the metal clip 200. The influence of the stray magnetic field on the sensing results is clearly visible in FIG. 15B. The influence of the stray magnetic field can be suppressed by employing a differential measuring method, where a first magnetic field sensing component 104a is placed in close proximity to the first section 202 of the metal clip 200 and a second magnetic field sensing component 104b is placed in close proximity to the second section 204 of the metal clip 200. By taking the difference of the sensor component outputs (X1–X2), the influence of the homogeneous stray magnetic field is eliminated as indicated in the bottom part of FIG. 15B.

Figures 16A, 16B:
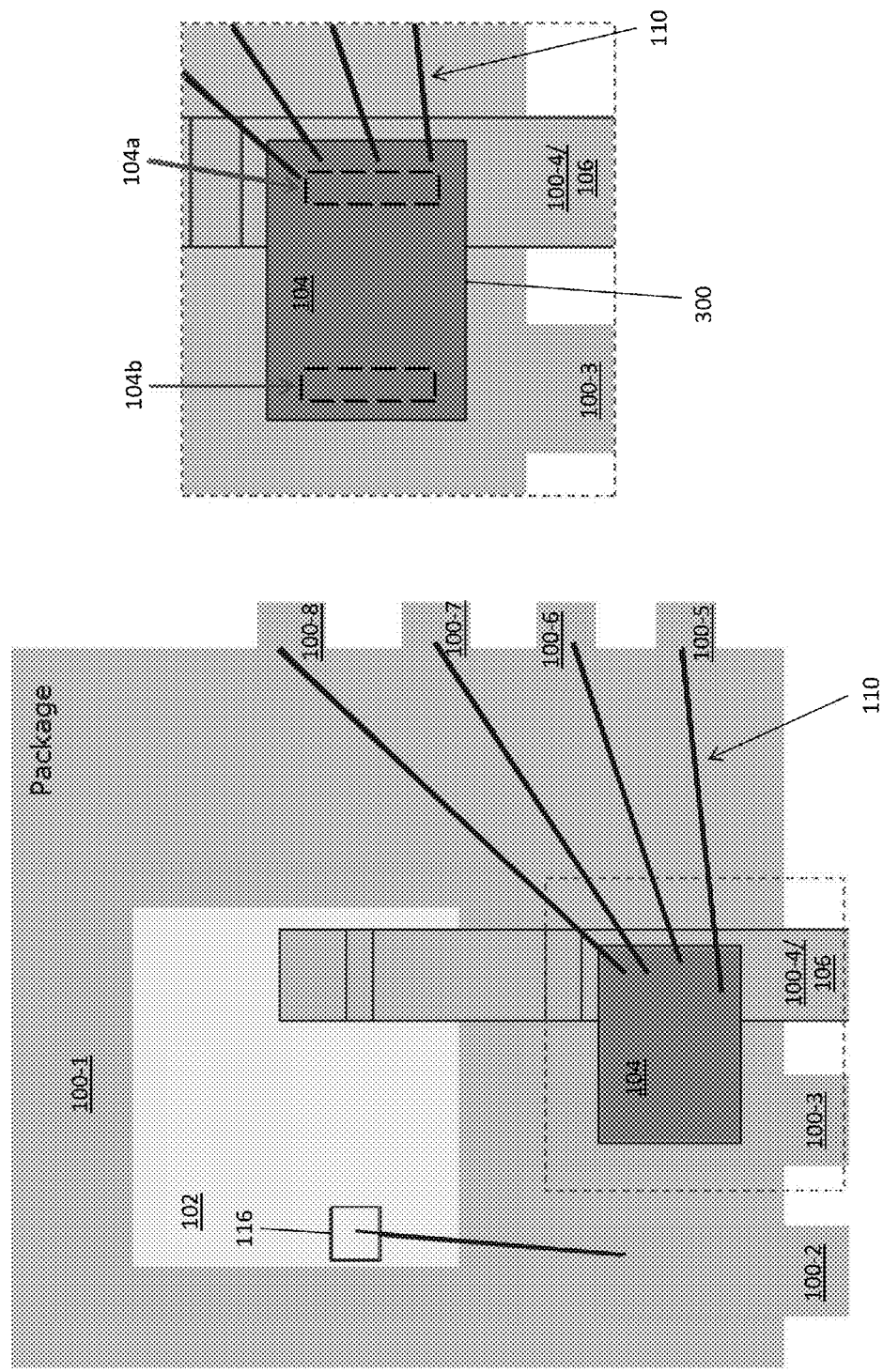
FIG. 16A illustrates a top down plan view of a fifteenth embodiment of a semiconductor package having an integrated magnetic field sensor.
FIG. 16B illustrates an enlarged view of a region of the package shown in FIG. 16A.

FIG. 16A illustrates a top down plan view of a fifteenth embodiment of the semiconductor package, and FIG. 16B illustrates an exploded view of the region included in the dashed both shown in FIG. 16A. The embodiment shown in FIGS. 16A and 16B is similar to the embodiment shown in FIGS. 14A and 14B. Different, however, the first and the second magnetic field sensing components 104a, 104b of the magnetic field sensor 104 are integrated in the same sensor die 300 and therefore fixed in the same plane. The sensor die 300 is attached to different leads/metal clips 100-3, 100-4/106 of the semiconductor package. The first lead/metal clip 100-3 is electrically connected to a first terminal (e.g. collector or drain) of the semiconductor die 102, and the second metal clip 100-3 is electrically connected to a second terminal (e.g. emitter or source) of the semiconductor die 102. Current flowing in the current pathway traverses a different direction along the first lead/metal clip 100-4/106 than along the second lead/metal clip 100-3. The first magnetic field sensing component 104a is adjacent the first lead/metal clip 100-4/106 and the second magnetic field sensing component 104b is adjacent the second lead/metal clip 100-3. Current entering the semiconductor die 102 traverses the first lead/metal clip 100-4/106 in a first direction. Current exiting the semiconductor die 102 traverses the second lead/metal clip 100-3 in the opposite direction. As a result, the magnetic field produced by current flowing in the current pathway impinges on the first magnetic field sensing component 104a in the opposite direction as the first magnetic field sensing component 104a.

Figure 17:
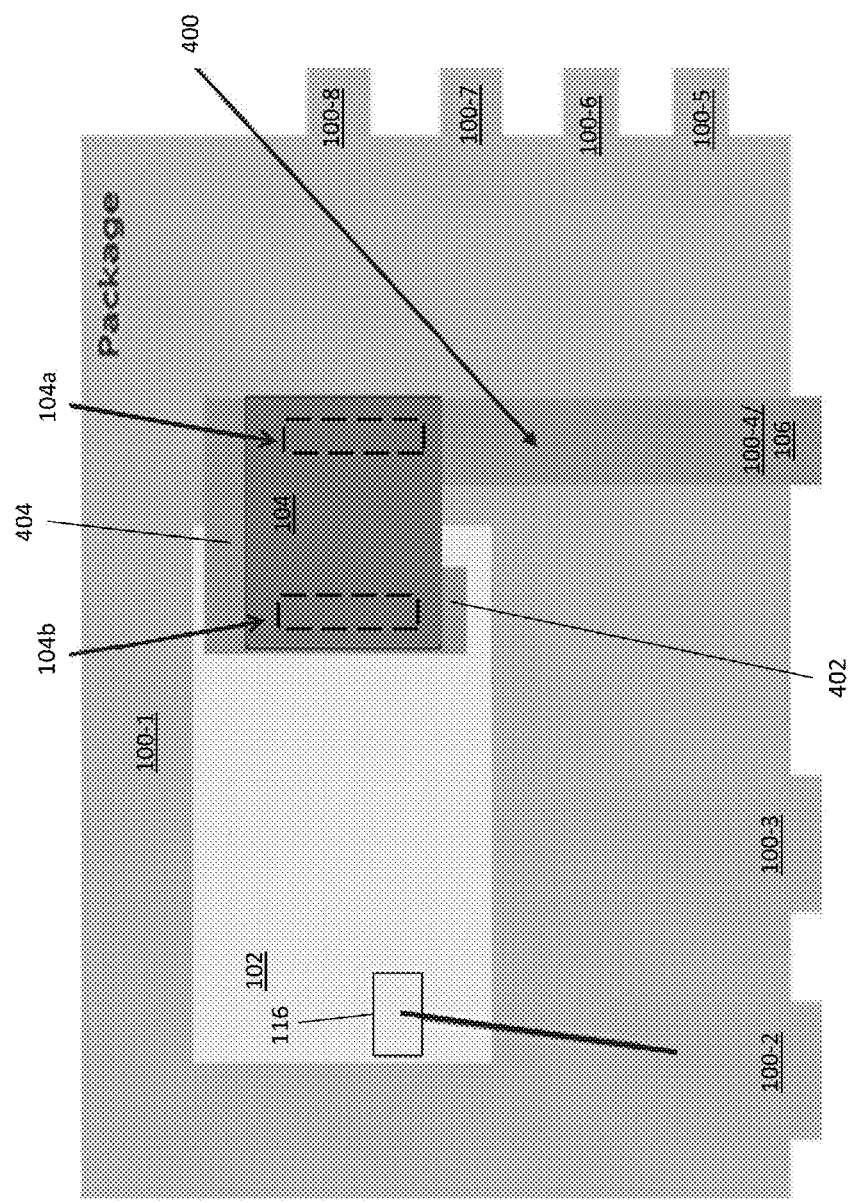
FIG. 17 illustrates a top down plan view of a sixteenth embodiment of a semiconductor package having an integrated magnetic field sensor.

FIG. 17 illustrates a top down plan view of a sixteenth embodiment of the semiconductor package. The embodiment shown in FIG. 17 is similar to the embodiment shown in FIGS. 16A and 16B. Different, however, the sensor die that includes the first and the second magnetic field sensing components 104a, 104b is attached to the same lead/metal clip 100-4/106. The lead/metal clip 100-4/106 is electrically connected to a terminal (e.g. emitter or source) of the semiconductor die 102. The lead/metal clip 100-4/106 comprises a first section 400 and a second section 402 which are spaced apart from each other and extend in parallel with one another as part of the current pathway. A third section 404 of the lead/metal clip 100-4/106 extends perpendicular between the first and the second sections 400, 402, and connects the first section 400 to the second section 402. The ends of the first and the second sections 400, 402 are not connected physically to one another. Current flowing in the current pathway traverses a different direction along the first section 400 of the lead/metal clip 100-4/106 than along the second section 402 of the lead/metal clip 100-4/106 e.g. as previously described herein in connection with FIGS. 15A and 15B. The first magnetic field sensing component 104a is adjacent the first section 400 of the lead/metal clip 100-4/106, and the second magnetic field sensing component 104b is adjacent the second section 402 of the lead/metal clip 100-4/106. This way, current flowing in the lead/metal clip 100-4/106 impinges on the first magnetic field sensing component 104a in the opposite direction as the second magnetic field sensing component 104b so that stray field contributions are cancelled by the differential sensing method described herein.

In one embodiment, the first section 400 of the lead/metal clip 100-4/106 extends beyond the footprint of the semiconductor die 102 and the first magnetic field sensing component 104a is adjacent the first section 400 outside the footprint of the semiconductor die 102. The second magnetic field sensing component 104b is adjacent the second section 402 inside the footprint of the semiconductor die 102.

Figure 18:
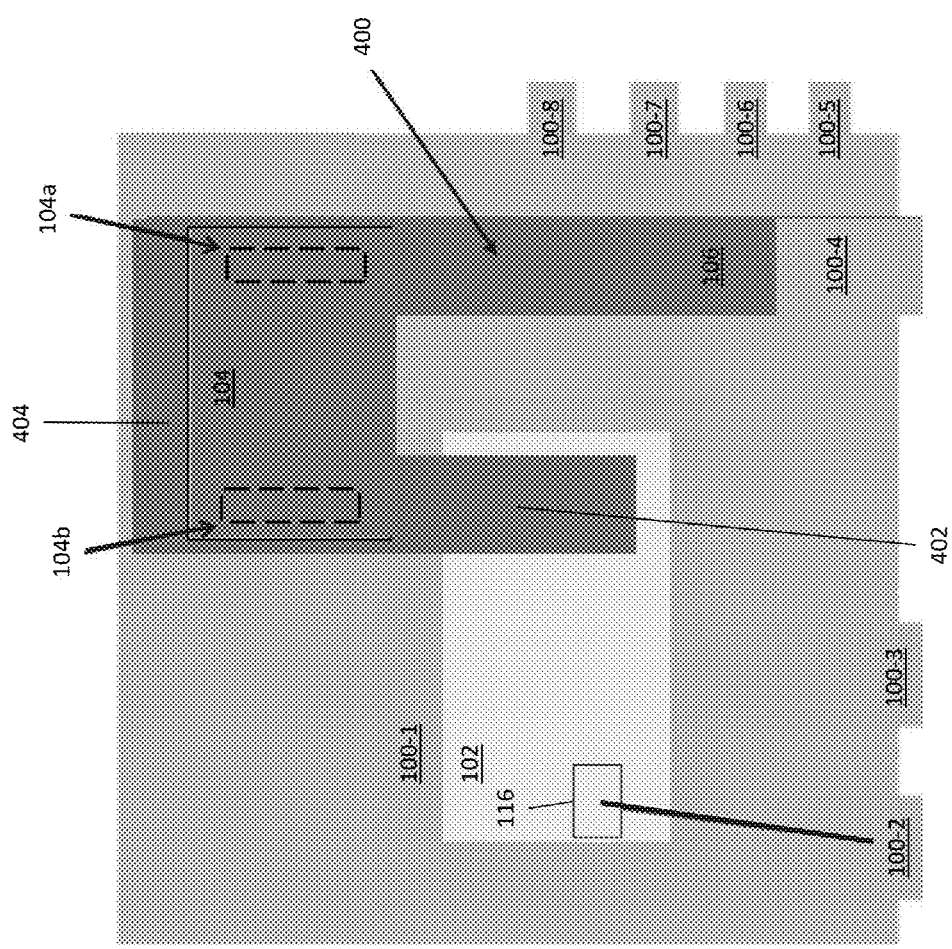
FIG. 18 illustrates a top down plan view of a seventeenth embodiment of a semiconductor package having an integrated magnetic field sensor.

FIG. 18 illustrates a top down plan view of a seventeenth embodiment of the semiconductor package. The embodiment shown in FIG. 18 is similar to the embodiment shown in FIG. 17. Different, however, the second section 402 of the lead/metal clip 100-4/106 also extends beyond the footprint of the semiconductor die 102. This way, both magnetic field sensing components 104a, 104b are adjacent to the respective sections 400, 402 of the lead/metal clip 100-4/106 outside the footprint of the semiconductor die 102. With this configuration, perturbations in the current flowing in the semiconductor die 102 have less effect on the magnetic field sensed by the magnetic field sensing components 104a, 104b of the magnetic field sensor 104, because the magnetic field sensing components 104a, 104b are not positioned over or under the semiconductor die 102 but instead are laterally offset from the die 102 in the vertical direction.

In one embodiment, the semiconductor die 102 includes a power transistor controlled by a switching signal applied to the gate 116 of the power transistor. The switching signal controls switching of the power transistor during which perturbations occur in current flowing through the power transistor. A difference signal corresponding to the difference between the electrical signals output by the magnetic field sensing components 104a, 104b of the magnetic field sensor 104 can be processed so as to suppress the effect of the perturbations on the measured magnetic field, based on timing information associated with the switching signal. For example, the switching signal can be a PWM (pulse width modulation) signal applied to the gate 116 of the power transistor. In this example, the timing information corresponds to at least one of the duty cycle and frequency of the PWM signal. A controller (not shown) which provides the PWM signal is aware of the duty cycle and frequency of the PWM signal. As such, the controller is aware of when the power transistor is switched on, switched off and how long the power transistor remains on or off. Based on this timing information, the controller knows when perturbations occur in current flowing through the power transistor and can process the difference signal to remove or at least reduce the influence of these perturbations on the measurement results produced by the sensor components 104a, 104b e.g. by ignoring, filtering, etc. the difference signal during known perturbation periods.

Figure 19B:
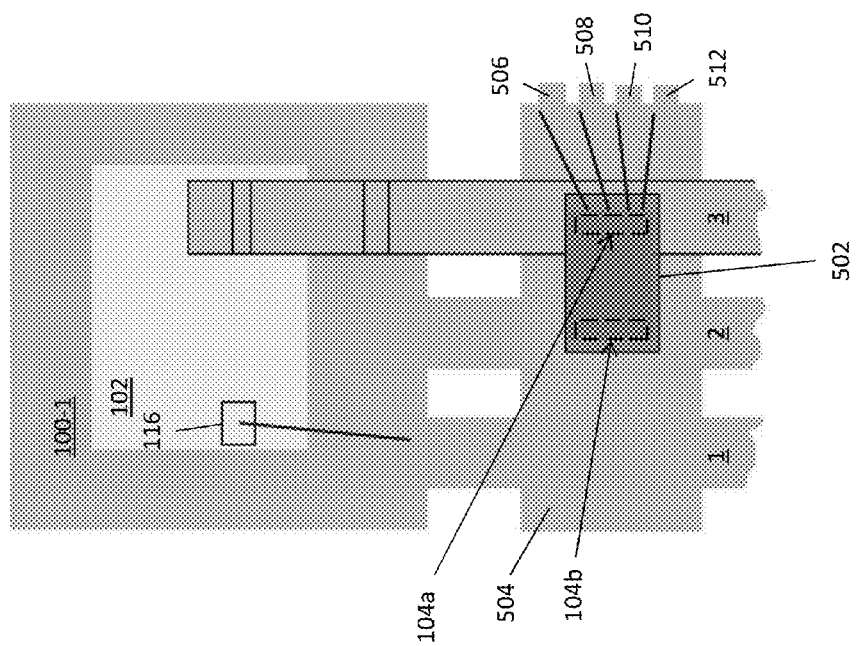
FIG. 19B illustrates an enlarged sectional view of a region of the package shown in FIG. 19A.
Figure 19A:
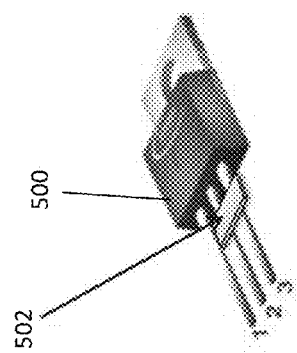
FIG. 19A illustrates a perspective view of an eighteenth embodiment of a semiconductor package having an integrated magnetic field sensor.

FIG. 19A illustrates a perspective view of an eighteenth embodiment of the semiconductor package, and FIG. 19B illustrates a more detailed plan view of the package shown in FIG. 19A. The embodiment shown in FIGS. 19A and 19B is similar to the embodiment shown in FIGS. 16A and 16B. Different, however, the magnetic field sensor 104 is attached to the outside of the package on the current carrying connections in order to sense the magnetic field. The semiconductor package can be, for example, a transistor outline (TO) package or other type of standard semiconductor package which has a first lead 3 electrically connected to a first terminal (e.g. emitter or source) of the semiconductor die 102, a second lead 2 electrically connected to a second terminal (e.g. collector or drain) of the semiconductor die 102, a third lead 1 electrically connected to a third terminal (e.g. gate) of the semiconductor die 102, and an encapsulant 500 encasing the semiconductor die 102. The leads 1, 2, 3 protrude from the encapsulant 500. The first and the second magnetic field sensing components 104a, 104b of the magnetic field sensor 104 are integrated in the same sensor die 502, and the sensor die 502 is attached to the same side of at least two of the leads 1, 2, 3, outside the encapsulant 500. The first magnetic field sensing component 104a extends along the first lead 3 and the second magnetic field sensing component 104b extends along the second lead 2. Current flowing in the current pathway traverses a different direction along the first lead 3 (e.g. emitter or source lead) than along the second lead 2 (e.g. collector or drain lead). In the configuration shown in FIGS. 19A and 19B, the current flows in the opposite direction along the first and the second leads 3, 2. As such, the magnetic field produced by the current flowing into the semiconductor die 102 along the first lead 3 and out of the semiconductor die 102 along the second lead 2 impinges on the first magnetic field sensing component 104a in the opposite direction as the second magnetic field sensing component 104b.

The semiconductor package may further include an additional substrate 504 attached to the leads 1, 2, 3, outside the encapsulant 500, the additional substrate being attached to the opposite side of the leads 1, 2, 3 as the sensor die 502. Terminals of the sensor die 502 are electrically connected to leads 506, 508, 510, 512 of the additional substrate 504 so as to provide points of external electrical contact for accessing the electrical signals output by the magnetic field sensing components 104, 104b of the magnetic field sensor 104 included in the sensor die 502.

Figure 20:
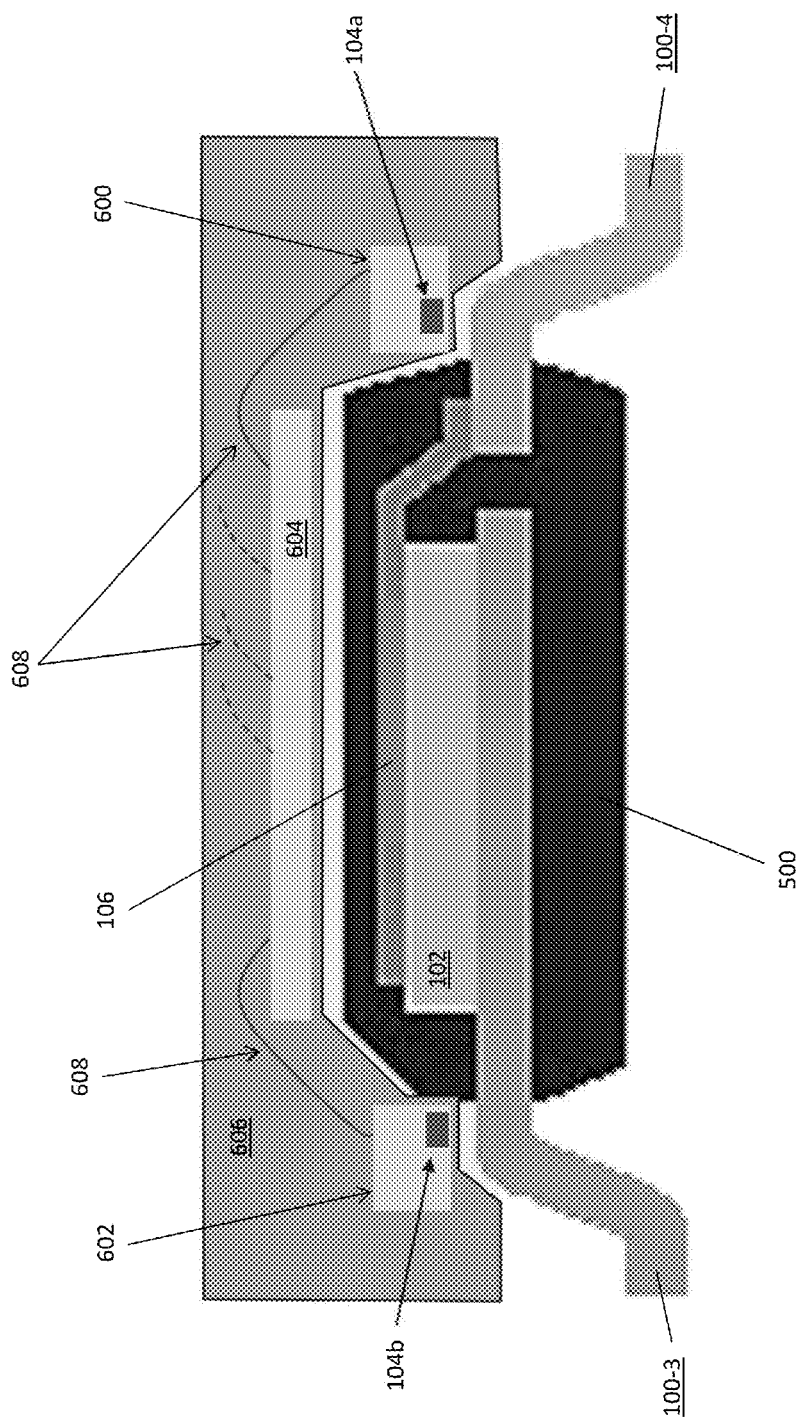
FIG. 20 illustrates a sectional view of a nineteenth embodiment of a semiconductor package having an integrated magnetic field sensor.

FIG. 20 illustrates a sectional view of a nineteenth embodiment of the semiconductor package. The embodiment shown in FIG. 20 is similar to the embodiment shown in FIGS. 19A and 19B. Different, however, is the type of package. According to the embodiment shown in FIG. 20, semiconductor package is a surface mount package. The emitter/source lead 100-4 of the semiconductor package protrudes from the encapsulant 500 at the opposite side of the package as the collector/drain lead 100-3. Current flowing in the current pathway traverses a different direction along the emitter/source lead 100-4 than along the collector/drain lead 100-3. The magnetic field sensing components 104a, 104b of the magnetic field sensor 104 are disposed in separate sensor dies 600, 602. The sensor die 600 with the first magnetic field sensing component 104a is attached to the emitter/source lead 100-4, and the sensor die 602 with the second magnetic field sensing component 104b is attached to the collector/drain lead 100-3.

The semiconductor package may further include an additional substrate 604 encased by an encapsulant 606. The same or different encapsulant can be used to encase the semiconductor die 102 and the additional substrate 604. Terminals of the separate sensor dies 600, 602 are electrically connected to leads of the additional substrate 604 by electrical conductors 608 such as wire bonds, wire ribbons, etc. so as to provide points of external electrical contact for accessing the electrical signals output by the magnetic field sensing components 104*a*, 104*b* of the magnetic field sensor 104.

The embodiments described in connection with FIGS. 14A to 20 allow for sensing of current in a semiconductor package which includes a semiconductor die attached to a substrate and a magnetic field sensor included as part of the same semiconductor package as the semiconductor die and positioned in close proximity to a current pathway of the semiconductor die. The current sensing method includes producing a first electrical signal by a first magnetic field sensing component which is galvanically isolated from the current pathway and positioned so that a magnetic field produced by current flowing in the current pathway impinges on the first magnetic field sensing component in a first direction, the first electrical signal being proportional to the magnetic field. The current sensing method also includes producing a second electrical signal by a second magnetic field sensing component which is galvanically isolated from the current pathway and positioned so that the magnetic field impinges on the second magnetic field sensing component in a different than the first direction, the second electrical signal being proportional to the magnetic field. The current sensing method further includes producing a third electrical signal as the difference between the first electrical signal and the second electrical signal.

The first and the second magnetic field sensing components can be positioned so that the magnetic field impinges on the first magnetic field sensing component in the opposite direction as the second magnetic field sensing component as previously described herein. This way, the magnitude of the magnetic field sensed by the first magnetic field sensing component is constructively combined with the magnitude of the magnetic field sensed by the second magnetic field sensing component and any stray magnetic field measurements made by the first and the second magnetic field sensing components are cancelled from the third electrical signal produced by the current sensing method.

In some cases, the semiconductor die may include one or more power transistors controlled by a switching signal that controls switching of the power transistor(s) during which perturbations occur in current flowing through the power transistor(s). For these cases, the current sensing method can further comprises processing the third electrical signal so as to suppress the effect of the perturbations on the magnetic field, based on timing information associated with the switching signal. For example, the switching signal can be a PWM (pulse width modulation) signal and the timing information corresponds to at least one of a duty cycle and frequency of the PWM signal. Based on this information, a controller which generates the PWM signal knows when perturbations occur in current flowing through the power transistor(s) and can process the third electrical signal so as to remove or at least reduce the influence of these perturbations on the measurement results produced by the magnetic field sensing components e.g. by ignoring, filtering, etc. the third electrical signal during known perturbation periods as previously described herein.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a semiconductor die attached to a substrate; and
a magnetic field sensor included as part of the same semiconductor package as the semiconductor die and positioned in close proximity to a current pathway of the semiconductor die so that the magnetic field sensor can sense a magnetic field produced by current flowing in the current pathway, the magnetic field sensor comprising:
a first magnetic field sensing component galvanically isolated from the current pathway and positioned so that a magnetic field produced by current flowing in the current pathway impinges on the first magnetic field sensing component in a first direction; and
a second magnetic field sensing component galvanically isolated from the current pathway and positioned so that the magnetic field impinges on the second magnetic field sensing component in a second direction different than the first direction.

2. The semiconductor package of claim 1, wherein the magnetic field sensor is operable to produce an electrical signal which is proportional to the magnetic field, and wherein the electrical signal comprises a first signal component output by the first magnetic field sensing component and a second signal component output by the first magnetic field sensing component.

3. The semiconductor package of claim 1, wherein each magnetic field sensing component of the magnetic field sensor is a magnetoresistive magnetic field sensing component or a Hall magnetic field sensing component.

4. The semiconductor package of claim 1, wherein the first and the second magnetic field sensing components are positioned so that the magnetic field impinges on the first magnetic field sensing component in the opposite direction as the second magnetic field sensing component.

5. The semiconductor package of claim 1, wherein the first and the second magnetic field sensing components are integrated in the same sensor die.

6. The semiconductor package of claim 1, wherein the first and the second magnetic field sensing components are fixed in the same plane.

7. The semiconductor package of claim 1, wherein at least one of the first and the second magnetic field sensing components is a three-dimensional magnetic field sensing component operable to produce an electrical signal which is proportional to the distance between the current pathway and the three-dimensional magnetic field sensing component.

8. The semiconductor package of claim 1, further comprising:
a lead or metal clip electrically connected to a terminal of the semiconductor die, wherein current flowing in the current pathway traverses along the lead/metal clip, wherein the first magnetic field sensing component is adjacent a first side of the lead/metal clip and the second magnetic field sensing component is adjacent a second side of the lead/metal clip opposite the first side.

9. The semiconductor package of claim 1, further comprising:

a lead or metal clip electrically connected to a terminal of the semiconductor die, wherein the lead/metal clip comprises a first section and a second section which are spaced apart from each other and extend in parallel with one another as part of the current pathway, wherein current flowing in the current pathway traverses a different direction along the first section of the lead/metal clip than along the second section of the lead/metal clip, wherein the first magnetic field sensing component is adjacent the first section and the second magnetic field sensing component is adjacent the second section.

10. The semiconductor package of claim 9, wherein the first section of the lead/metal clip extends beyond a footprint of the semiconductor die, wherein the first magnetic field sensing component is adjacent the first section outside the footprint of the semiconductor die, and wherein the second magnetic field sensing component is adjacent the second section inside the footprint of the semiconductor die.

11. The semiconductor package of claim 9, wherein the first section of the lead/metal clip extends beyond a footprint of the semiconductor die, wherein the second section of the lead/metal clip extends beyond the footprint of the semiconductor die, wherein the first magnetic field sensing component is adjacent the first section outside the footprint of the semiconductor die, and wherein the second magnetic field sensing component is adjacent the second section outside the footprint of the semiconductor die.

12. The semiconductor package of claim 1, further comprising:

a first lead or metal clip electrically connected to a first terminal of the semiconductor die; and a second lead or metal clip electrically connected to a second terminal of the semiconductor die, wherein current flowing in the current pathway traverses a different direction along the first lead/metal clip than along the second lead/metal clip, wherein the first magnetic field sensing component is adjacent the first lead/metal clip and the second magnetic field sensing component is adjacent the second lead/metal clip.

13. The semiconductor package of claim 1, further comprising:

a first lead electrically connected to a first terminal of the semiconductor die;

a second lead electrically connected to a second terminal of the semiconductor die; and an encapsulant encasing the semiconductor die, wherein the first and the second leads protrude from the encapsulant, wherein the first and the second magnetic field sensing components are integrated in the same sensor die, wherein the sensor die is attached to a same side of the first and the second leads outside the encapsulant, wherein current flowing in the current pathway traverses a different direction along the first lead than along the second lead, wherein the first magnetic field sensing component extends along the first lead and the second magnetic field sensing component extends along the second lead.

14. The semiconductor package of claim 13, further comprising:

an additional substrate attached to the first and the second leads outside the encapsulant, wherein the additional substrate is attached to the opposite side of the first and the second leads as the sensor die outside the encapsulant, wherein terminals of the sensor die are electrically connected to leads of the additional substrate.

15. The semiconductor package of claim 1, further comprising:

a first lead electrically connected to a first terminal of the semiconductor die;

a second lead electrically connected to a second terminal of the semiconductor die; and an encapsulant encasing the semiconductor die, wherein the first and the second leads protrude from the encapsulant at opposite sides of the semiconductor package, wherein current flowing in the current pathway traverses a different direction along the first lead than along the second lead, wherein the first and the second magnetic field sensing components are disposed in separate sensor dies, wherein the sensor die with the first magnetic field sensing component is adjacent the first lead, wherein the sensor die with the second magnetic field sensing component is adjacent the second lead.

16. The semiconductor package of claim 15, further comprising:

an additional substrate encased by the encapsulant, wherein terminals of the separate sensor dies are electrically connected to leads of the additional substrate.

17. A method of sensing current in a semiconductor package which includes a semiconductor die attached to a substrate and a magnetic field sensor included as part of the same semiconductor package as the semiconductor die and positioned in close proximity to a current pathway of the semiconductor die so that the magnetic field sensor can sense a magnetic field produced by current flowing in the current pathway, the method comprising:

producing a first electrical signal by a first magnetic field sensing component which is galvanically isolated from the current pathway and positioned so that a magnetic field produced by current flowing in the current pathway impinges on the first magnetic field sensing component in a first direction, the first electrical signal being proportional to the magnetic field;

producing a second electrical signal by a second magnetic field sensing component which is galvanically isolated from the current pathway and positioned so that the magnetic field impinges on the second magnetic field sensing component in a second direction different than the first direction, the second electrical signal being proportional to the magnetic field; and producing a third electrical signal which is the difference between the first electrical signal and the second electrical signal.

18. The method of claim 17, wherein the first and the second magnetic field sensing components are positioned so that the magnetic field impinges on the first magnetic field sensing component in the opposite direction as the second magnetic field sensing component and so that the magnitude of the magnetic field sensed by the first magnetic field sensing component is constructively combined with the magnitude of the magnetic field sensed by the second magnetic field sensing component and any stray magnetic field measurements made by the first and the second magnetic field sensing components are cancelled.

19. The method of claim 17, wherein the semiconductor die includes a power transistor controlled by a switching signal that controls switching of the power transistor during which perturbations occur in current flowing through the power transistor, the method further comprising:
  processing the third electrical signal so as to suppress the effect of the perturbations on the magnetic field, based on timing information associated with the switching signal.

20. The method of claim 19, wherein the switching signal is a PWM (pulse width modulation) signal, and wherein the timing information corresponds to at least one of a duty cycle and frequency of the PWM signal.

* * * * *